United States Patent [19]
Koenck

[11] Patent Number: 5,883,493
[45] Date of Patent: *Mar. 16, 1999

[54] BATTERY PACK HAVING MEMORY

[75] Inventor: Steven E. Koenck, Cedar Rapids, Iowa

[73] Assignee: Intermec Technologies Corporation, Everett, Wash.

[*] Notice: The term of this patent shall not extend beyond the expiration date of Pat. No. 4,553,081.

[21] Appl. No.: 841,974

[22] Filed: Apr. 8, 1997

Related U.S. Application Data

[63] Continuation of Ser. No. 415,075, Mar. 30, 1995, Pat. No. 5,619,117, which is a continuation-in-part of Ser. No. 134,881, Oct. 12, 1993, Pat. No. 5,508,599, which is a continuation of Ser. No. 769,337, Oct. 1, 1991, Pat. No. 5,278,487, which is a continuation of Ser. No. 544,230, Jun. 26, 1990, abandoned, which is a division of Ser. No. 422,226, Oct. 16, 1989, Pat. No. 4,961,043, which is a division of Ser. No. 168,352, Mar. 15, 1988, Pat. No. 4,885,523, which is a continuation-in-part of Ser. No. 944,503, Dec. 18, 1986, Pat. No. 4,737,702, which is a continuation-in-part of Ser. No. 876,194, Jun. 19, 1986, Pat. No. 4,709,202, which is a division of Ser. No. 797,235, Nov. 12, 1985, Pat. No. 4,716,354, which is a continuation-in-part of Ser. No. 612,588, May 21, 1984, Pat. No. 4,553,081, which is a continuation-in-part of Ser. No. 385,830, Jun. 7, 1982, Pat. No. 4,455,523.

[51] Int. Cl.$^6$ .................................................. H02J 7/00
[52] U.S. Cl. ................................ 320/114; 320/106
[58] Field of Search ................................ 320/107, 110, 320/112, 113, 114, 115, 106; 324/426–435

[56] References Cited

U.S. PATENT DOCUMENTS 3,683,258  8/1972  Harbonn .
3,740,636  6/1973  Hogrefe et al. .
3,754,182  8/1973  Morris et al. .

(List continued on next page.)

FOREIGN PATENT DOCUMENTS

WO 91/08604  6/1991  European Pat. Off. .

OTHER PUBLICATIONS

Norand Corporation Specification Sheet for Norand 101–XL Portable Data System. 1978.

Norand Corporation Brochure regarding Norand "Spring 100" Portable Order Entry Terminal, 1979.

Norand Corporation Specification Sheet for Norand 101XL "Alpha–1" Portable Data System, 1980.

*Primary Examiner*—Peter S. Wong
*Assistant Examiner*—K. Shin
*Attorney, Agent, or Firm*—McAndrews, Held & Malloy, Ltd.

[57] ABSTRACT

In an exemplary embodiment, a battery conditioning system monitors battery conditioning and includes a memory for storing data based thereon; for example, data may be stored representative of available battery capacity as measured during a deep discharge cycle. With a microprocessor monitoring battery operation of a portable unit, a measure of remaining battery capacity can be calculated and displayed. Where the microprocessor and battery conditioning system memory are permanently secured to the battery so as to receive operating power therefrom during storage and handling, the performance of a given battery in actual use can be accurately judged since the battery system can itself maintain a count of accumulated hours of use and other relevant parameters. In the case of a non-portable conditioning system, two-way communication may be established with a memory associated with the portable unit so that the portable unit can transmit to the conditioning system information concerning battery parameters (e.g. rated battery capacity) and/or battery usage (e.g. numbers of shallow discharge and recharge cycles), and after a conditioning operation, the conditioning system can transmit to the portable unit a measured value of battery capacity, for example. A battery pack having memory stores battery history and identifying data to be retrieved by a portable battery powered device. Battery status information may be utilized in conjunction with characteristic battery history data in order to optimize charging and discharging functions and to maximize the useful life of a battery pack.

10 Claims, 26 Drawing Sheets

U.S. PATENT DOCUMENTS

| | | |
|---|---|---|
| 3,763,416 | 10/1973 | Jache . |
| 3,771,132 | 11/1973 | Biewer . |
| 3,775,659 | 11/1973 | Carlsen, II . |
| 3,823,388 | 7/1974 | Chadima, Jr. et al. . |
| 3,911,350 | 10/1975 | Swope . |
| 3,917,990 | 11/1975 | Sherman . |
| 3,921,050 | 11/1975 | Rowas . |
| 3,928,792 | 12/1975 | Mullersman et al. . |
| 3,971,980 | 7/1976 | Jungfer et al. . |
| 3,979,656 | 9/1976 | Takeda et al. . |
| 4,001,550 | 1/1977 | Schatz . |
| 4,017,725 | 4/1977 | Roen . |
| 4,045,720 | 8/1977 | Alexandres . |
| 4,061,956 | 12/1977 | Brown et al. . |
| 4,072,859 | 2/1978 | McWaters . |
| 4,095,217 | 6/1978 | Tani et al. . |
| 4,121,115 | 10/1978 | de Mere . |
| 4,125,802 | 11/1978 | Godard . |
| 4,127,803 | 11/1978 | Etienne . |
| 4,140,957 | 2/1979 | Rapp . |
| 4,151,454 | 4/1979 | Iida . |
| 4,158,194 | 6/1979 | McWaters . |
| 4,173,733 | 11/1979 | Sugalski et al. . |
| 4,203,103 | 5/1980 | Osada et al. . |
| 4,237,411 | 12/1980 | Kothe et al. . |
| 4,277,837 | 7/1981 | Stuckert . |
| 4,289,836 | 9/1981 | Lemelson ................... 429/61 |
| 4,295,097 | 10/1981 | Thompson et al. . |
| 4,308,492 | 12/1981 | Mori et al. . |
| 4,308,493 | 12/1981 | Kothe et al. . |
| 4,346,336 | 8/1982 | Crawford . |
| 4,370,606 | 1/1983 | Kakumoto et al. . |
| 4,377,787 | 3/1983 | Kikuoka et al. . |
| 4,412,137 | 10/1983 | Hansen et al. ....................... 307/10 R |
| 4,419,616 | 12/1983 | Baskins et al. . |
| 4,455,523 | 6/1984 | Koenck . |
| 4,472,672 | 9/1984 | Pacholok . |
| 4,494,064 | 1/1985 | Harkness . |
| 4,553,081 | 11/1985 | Koenck ..................... 320/43 |
| 4,607,208 | 8/1986 | Vreeland . |
| 4,621,189 | 11/1986 | Kumar et al. . |
| 4,649,333 | 3/1987 | Moore . |
| 4,670,703 | 6/1987 | Williams . |
| 4,692,682 | 9/1987 | Lane et al. . |
| 4,709,202 | 11/1987 | Koenck et al. ....................... 320/48 X |
| 4,716,354 | 12/1987 | Hacker . |
| 4,723,079 | 2/1988 | Norton ....................... 307/5 |
| 4,737,702 | 4/1988 | Koenck . |
| 4,773,032 | 9/1988 | Uehara et al. . |
| 4,829,226 | 5/1989 | Nakamura . |
| 4,842,966 | 6/1989 | Omori et al. . |
| 4,845,419 | 7/1989 | Hacker . |
| 4,850,009 | 7/1989 | Zook et al. . |
| 4,885,523 | 12/1989 | Koenck . |
| 4,916,441 | 4/1990 | Gombrich . |
| 4,961,043 | 10/1990 | Koenck . |
| 4,965,738 | 10/1990 | Bauer et al. . |
| 5,110,226 | 5/1992 | Sherman et al. . |
| 5,200,689 | 4/1993 | Interiano et al. ......................... 320/20 |
| 5,204,611 | 4/1993 | Nor et al. . |
| 5,278,487 | 1/1994 | Koenck . |
| 5,349,282 | 9/1994 | McClure ..................... 320/32 |
| 5,349,535 | 9/1994 | Gupta ......................... 320/2 |
| 5,371,453 | 12/1994 | Fernandez ................... 320/5 |
| 5,422,558 | 6/1995 | Stewart ....................... 320/5 |
| 5,434,495 | 7/1995 | Toko ......................... 320/44 |
| 5,463,305 | 10/1995 | Koenck . |
| 5,508,599 | 4/1996 | Koenck . |
| 5,619,117 | 4/1997 | Koenck . |

BATTERY PACK HAVING MEMORY

CROSS-REFERENCE TO RELATED APPLICATIONS

The present application is a continuation of U.S. application Ser. No. 08/415,075 filed Mar. 30, 1995, Pat. No. 5,619,117 which is a continuation-in-part of U.S. application Ser. No. 08/134,881 (Attorney Docket No. 35717Y) filed Oct. 12, 1993 (now U.S. Pat. No. 5,508,599 issued Apr. 16, 1996), which is a continuation of U.S. application Ser. No. 07/769,337 (Attorney Docket No. 35717AAX) filed Oct. 1, 1991 (now U.S. Pat. No. 5,278,487 issued Jan. 11, 1994), which is a continuation of U.S. application Ser. No. 07/544,230 (Attorney Docket No. 5717AA) filed Jun. 26, 1990 (now abandoned), which is a division of U.S. application Ser. No. 07/422,226 (Attorney Docket No. 5717A) filed Oct. 16, 1989 (now U.S. Pat. No. 4,961,043 issued Oct. 2, 1990), which is a division of U.S. application Ser. No. 07/168,352 (Attorney Docket No. 5717Y) filed Mar. 15, 1988 (now U.S. Pat. No. 4,885,523 issued Dec. 5, 1989).

Said application U.S. application Ser. No. 07/168,352 is in turn a continuation-in-part of U.S. application Ser. No. 06/944,503 (Attorney Docket No. 5717X) filed Dec. 18, 1986 (now U.S. Pat. No. 4,737,702 issued Apr. 12, 1988), which is a continuation-in-part of U.S. application Ser. No. 06/876,194 (Attorney Docket No. 5717) filed Jun. 19, 1986 (now U.S. Pat. No. 4,709,202 issued Nov. 24, 1987), which is a division of U.S. application Ser. No. 06/797,235 (Attorney Docket No. 5768) filed Nov. 12, 1985 (now U.S. Pat. No. 4,716,354 issued Dec. 29, 1987), which is a continuation-in-part of U.S. application Ser. No. 06/612,588 (Attorney Docket No. 6165) filed May 21, 1984 (now U.S. Pat. No. 4,553,081 issued Nov. 12, 1985), which is a continuation-in-part of U.S. application Ser. No. 06/385,830 (Attorney Docket No. 6164) filed Jun. 7, 1982 (now U.S. Pat. No. 4,455,523 issued Jun. 19, 1984).

INCORPORATION BY REFERENCE

The disclosures and drawings of the before mentioned U.S. Pat. Nos. 4,455,523; 4,553,081; 4,709,202; 4,716,354; 4,737,702; 4,885,523; 4,961,043; and 5,278,487 are hereby incorporated herein by reference in their entirety.

The present invention may be utilized as or in conjunction with the battery pack including electronic power saver as described in PCT publication PCT/US90/06383 published May 16, 1991. Said publication PCT/US90/06383 is incorporated herein by reference in its entirety.

The present invention may be utilized as the rechargeable battery of a portable system as described in U.S. Pat. No. 5,363,031 issued Nov. 8, 1994. Said U.S. Pat. No. 5,363,031 is incorporated herein by reference in its entirety.

The present invention may be utilized as the rechargeable battery of a portable system as described in U.S. application Ser. No. 07/837,650 (Attorney Docket No. 6599XZ) filed Feb. 18, 1992. Said application Ser. No. 07/837,650 is incorporated herein by reference in its entirety.

The present invention may be protected from electrostatic discharge by utilizing the apparatus and method for electrostatic discharge protection as described in U.S. application Ser. No. 08/353,778 filed Dec. 12, 1994. Said application Ser. No. 08/353,778 is incorporated herein by reference in its entirety.

BACKGROUND OF THE INVENTION

The present invention relates to a battery conditioning system for battery means of portable computerized devices, and particularly to a hand-held device including data storage means for storing data pertinent to the battery means of the device, and to a battery conditioning control system including an external charging circuit equipped for communication with data storage means of the hand-held device and/or of the battery means operatively associated with such device. Preferably the control system is capable of optimizing the performance of a rechargeable electrochemical storage medium while at the same time maximizing its useful life. The invention also relates to control systems generally, and to control systems forming part of hand-held units.

Portable computerized systems are presently being extensively utilized in a wide range of applications. For example, such systems may be utilized in delivery vehicles which are to be away from a central warehouse or the like for a major part of each working day. Recharging operations may take place in locations subject to extremes of temperature. It is particularly crucial to avoid an equipment failure where a portable device is a vital link to the completion of scheduled tasks at remote locations and the like. In such circumstances, a loss of adequate battery power may be just as detrimental as any other malfunction.

Particularly where the battery conditioning control system is to be incorporated in hand-held devices, such control system should be lightweight and compact, and should consume minimum power. For the sake of economy, a microprocessor of a standard design and of minimum complexity is highly desirable.

It is conceived that a particularly advantageous battery conditioning system is achieved where significant portions of the conditioning circuitry are external to the battery operated portable device, and where the portable device contains data storage means which is capable of reliably and flexibly providing information, e.g., to the external circuitry for optimizing battery conditioning operations. Data storage means may be implemented within a battery pack in order to preserve battery characteristics of that particular battery so that unique battery data may be associated with the battery pack. The saved battery pack data may be accessed by a portable battery powered device in which the battery pack is utilized so that charging and discharging routines may be optimized for the particular battery pack.

SUMMARY OF THE INVENTION

It is a basic objective of the present invention to achieve a conditioning system for hand-held battery powered devices providing increased reliability and useful life, and particularly to provide a charging system for hand-held devices wherein charging operation can be based on the use history and/or other relevant information concerning the specific battery means.

A further object of the present invention is to provide a control system particularly adapted to control battery conditioning of a variety of rechargeable battery means, automatically adaptable to hand-held devices having battery means of different types such as to require different conditioning parameters.

Another object of the invention is to provide a charging current control system for battery powered portable devices which is not only lightweight and compact but which consumes minimum power, and which preferably is adapted to be implemented as an integrated circuit of an economical and simple construction.

An exemplary feature of the invention resides in the provision of a battery conditioning system receptive of different handheld devices and capable of communication therewith, e.g., to determine the type of conditioning required for respective different internal battery means thereof.

A further feature of the invention relates to a battery conditioning system wherein the system can obtain a relatively accurate indication of the battery energy remaining available for use for one type or a plurality of different types of batteries, and supply the results to a memory means accompanying the battery means during portable operation.

So as to recharge a battery system as rapidly as possible without detriment to an optimum useful life span, battery parameters including battery temperature may be monitored and transmitted to a conditioning system during a charging cycle, and the battery charging current may be adjusted accordingly.

Since a battery may deteriorate when subjected to repeated shallow discharge and recharging cycles, according to the present invention, a count of such shallow charge cycles may be automatically maintained throughout the operating life of the battery system, such that deep discharge cycles may be effected as necessary to maintain desired performance standards.

Furthermore, according to another highly significant feature of the invention, automatically operating battery monitoring and/or conditioning circuitry may be secured with the battery pack for handling as a unit therewith. The monitoring circuitry may receive its operating power from the battery pack during storage or handling such that a total history of the battery pack may be retained for example in a volatile memory circuit where such type of memory otherwise provides optimum characteristics for a portable system. The conditioning circuitry may have means for effecting a deep discharge cycle, and concomitantly with the deep discharge cycle, a measure of actual battery capacity may be obtained. From such measured battery capacity and a continuous measurement of battery current during portable operation, a relatively accurate "fuel gauge" function becomes feasible such that the risk of battery failure during field operation may be essentially eliminated. The performance of a given type of battery in actual use may be accurately judged since the battery system can itself maintain a count of accumulated hours of use, and other relevant parameters.

In a simplified system in successful use, the conditioning system is incorporated in the portable utilization device such that the programmed processor of the utilization device may itself automatically effect a deep discharge conditioning cycle and/or a deep discharge capacity test. The deep discharge cycle may be effected at a controlled rate, such that the time for discharge from a fully charged condition to a selected discharge condition may itself represent a measure of battery capacity. Instead of directly measuring battery current during use, the programmed processor may maintain a measure of operating time and/or elapsed time during portable operation, so as to provide an indication of remaining battery capacity. A time measure of operating time may be utilized to automatically determine the time duration of the next charging cycle. When both a main battery and a back-up battery are present, the operating time of each may be individually accumulated, and used to control the time duration of the respective recharging operations.

Additional features of a commercial system in successful use include individual charging and discharging circuits for a main battery and a back-up battery for reliable conditioning of the back-up battery independently of the state of the main battery. Desired parameters such as main battery voltage, ambient temperature (e.g. in the main battery case or in the battery compartment), and charging voltage may be obtained by means of an integrated circuit analog to digital converter, which thus replaces several comparators and many precision costly components of a prior implementation.

While in an early embodiment, battery charging current was set using a digital to analog converter to establish a set point for an analog current control loop, it is a feature of a further embodiment herein to provide a digital computer for both computing a desired current set point and for modulating current pulses in the battery charging circuit for maintaining a desired average current. Preferably, a computer circuit with a moderate clock rate may determine current pulse modulation steps and control sampling of actual current pulses for purposes of generating a feedback signal. An aliasing type of sampling systematically taken at different phases of the actual current pulse waveform enables use of a particularly low sampling rate.

In a further significant development of the invention, important portions of the conditioning circuitry are external to the battery operated portable device, and yet information specific to a given battery means is retained with the portable device. In an exemplary implementation, a computer operating means of the portable device is programmed and provided with battery information sufficient to select an optimum battery charging rate, for example, e.g., a fast charge or a maintenance charge, and preferably to adjust the charge rate e.g. based on a measure of battery temperature. In a presently preferred system, an external standardized charging circuit has a default condition wherein a charging current is supplied suitable to older types of terminals. Such a charging circuit, however, can be controlled by the computer operating means of preferred types of portable devices so as to override the default charging rate. In this way charging rate may be a function not only of a respective rated battery capacity, but also of other parameters such as battery terminal voltage prior to coupling of the portable device with the charging circuit and/or extent of use of the portable device after a previous charge. In certain applications with high peaks of battery drain, e.g. RF terminals, it is advantageous to avoid a resistance in series with the battery for measuring battery drain during use; an alternate approach measuring operating time in various modes can then be particularly attractive. An advantageous data communication coupling between a portable device computer operating means and a charging circuit may be effected via a data storage register and digital to analog converter. The register may be operated from a battery means while the computer operating means may be in a sleep mode, for example, once the register has received a suitable computer generated command. The digital analog converter need only be active during a battery charging cycle and can be decoupled from the battery means during portable operation. Such a digital to analog converter is particularly suitable for generating an analog control signal for overriding a default setting of a standardized charging circuit such as described hereinabove.

In a new RF terminal unit, it is conceived that it may be advantageous to make the output of a battery temperature measuring transducer available at an external contact of the terminal so that a low cost charger could supply a charging current taking account of a relatively accurate measure of battery temperature. Further by making temperature transducer (nonzero) output dependent on the presence of charging potential at the terminal, the same temperature sensing line provides an indication as to whether charging potential is present.

In a further embodiment of the present invention, a battery pack having memory may be implemented within the battery pack itself. The duty history of the battery along with present battery data may be stored to be later retrieved by a utilization device. The utilization device may determine present battery conditions in order to relay such information to the operator and may apply appropriate charging algorithms taking into account present battery conditions along with past characteristic charge/discharge behavior in order to optimize future battery charging and discharging. The characteristic behavior exhibited by the battery pack may be stored in an electronic memory system along with other battery pack identifying or tagging information. The battery pack having memory may be assembled using standard battery pack assembly techniques in order to maintain reliability and minimize the costs of the battery pack having memory.

The invention will now be described, by way of example and not by way of limitation, with references to the accompanying sheets of drawings; and other objects, features and advantages of the invention will be apparent from this detailed disclosure and from the appended claims.

DETAILED DESCRIPTION

The detailed description of FIGS. 1–8, 9A–9B, 10–15, 16A–B and 17 is incorporated herein by reference to the specification at col. 4, line 25, through col. 66, line 4, of the incorporated U.S. Pat. No. 4,709,202.

The detailed description of FIGS. 18–19, 20A–20B, and 21–27 is incorporated herein by reference to the specification at col. 5, line 50, through col. 20, line 6, of the incorporated U.S. Pat. No. 5,278,487.

Figure 1:
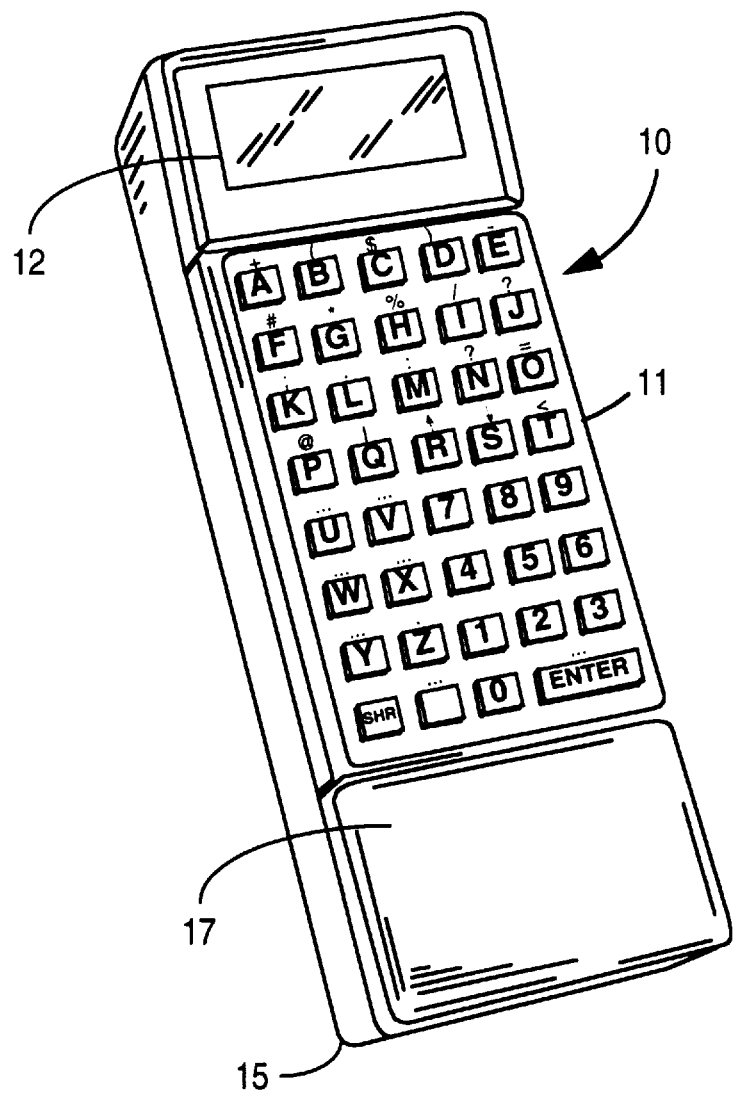
FIGS. 1–8, 9A–9B, 10–15, 16A–16B and 17 and the brief description thereof are incorporated herein by reference to U.S. Ser. No. 876,194, now U.S. Pat. No. 4,709,202 issued Nov. 24, 1987.
Figure 2:
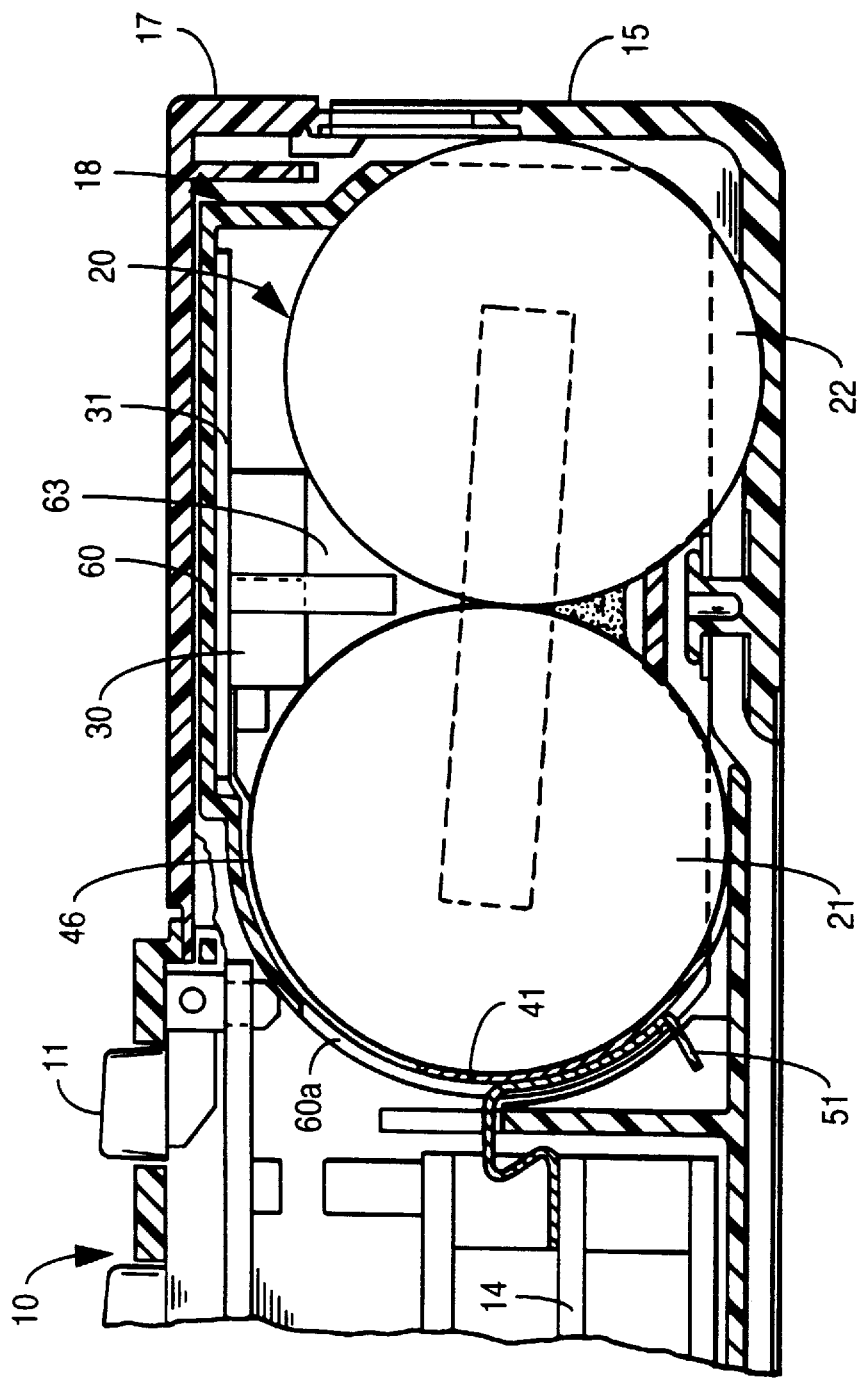
Figure 3:
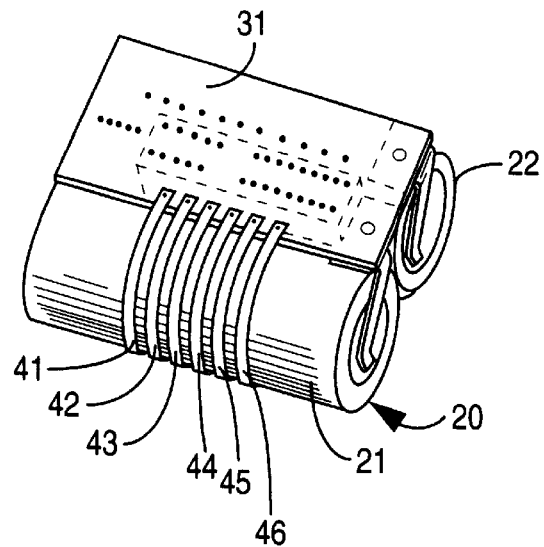
Figure 4:
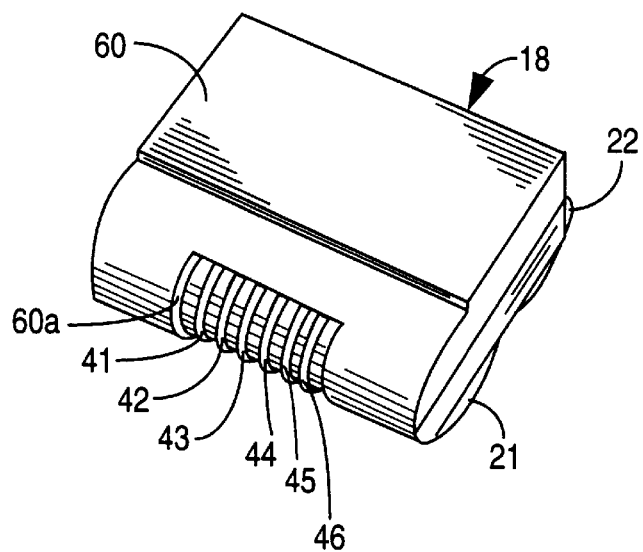
Figure 5:
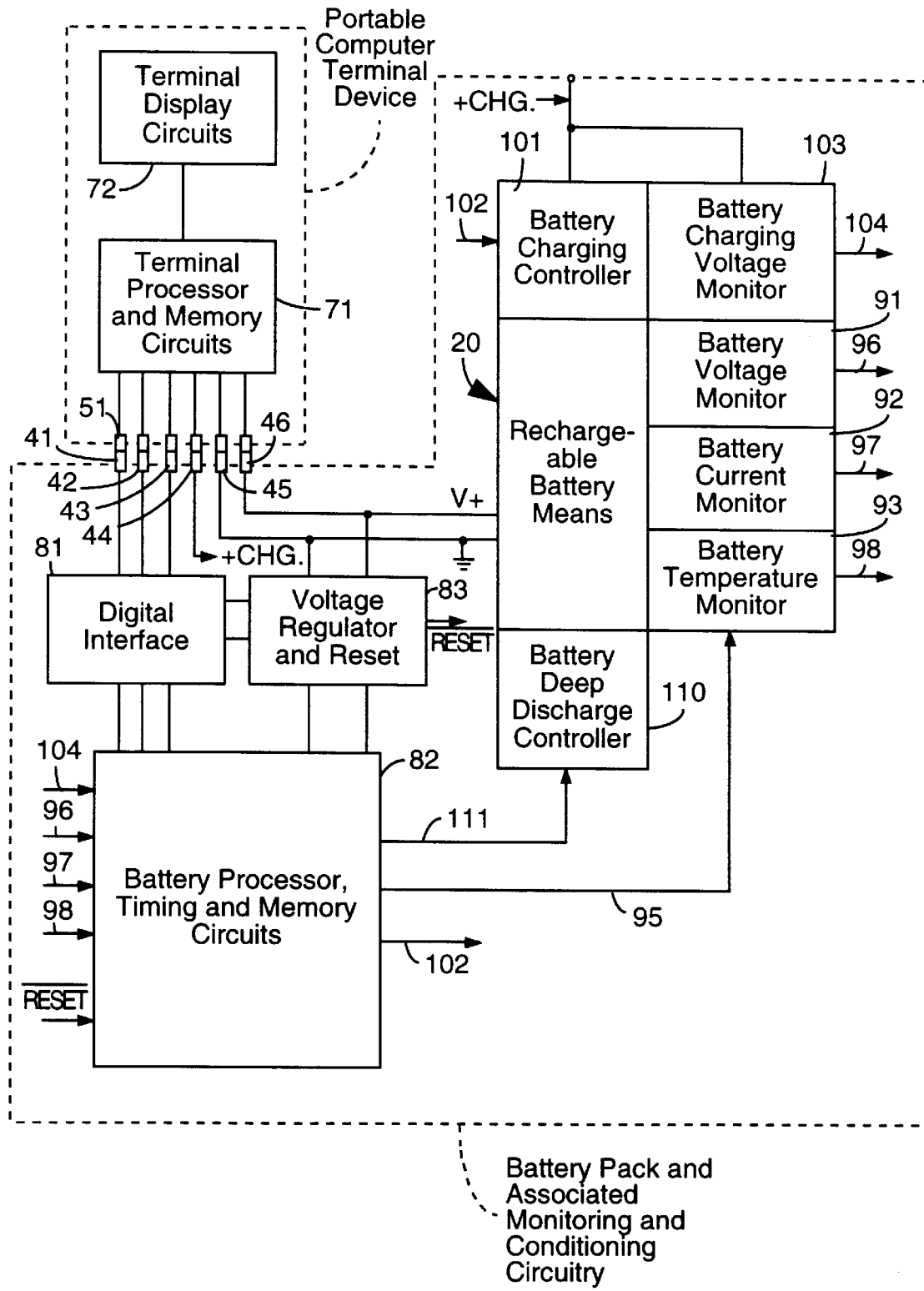
Figure 6:
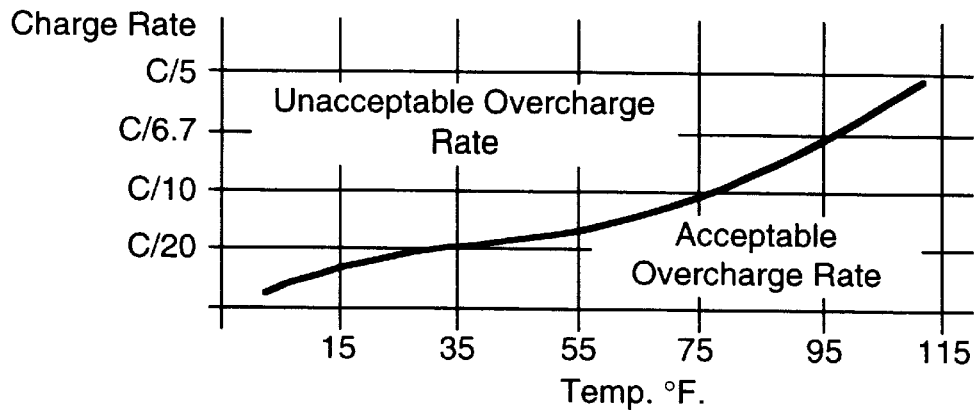
Figure 7:
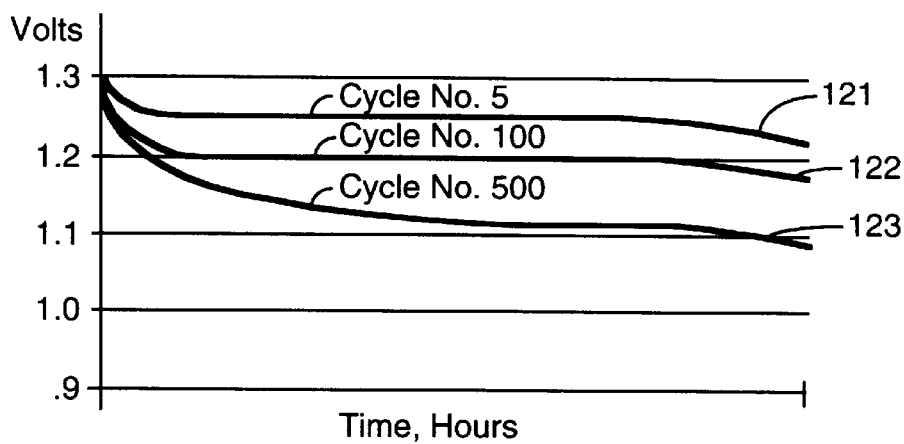
Figure 8:
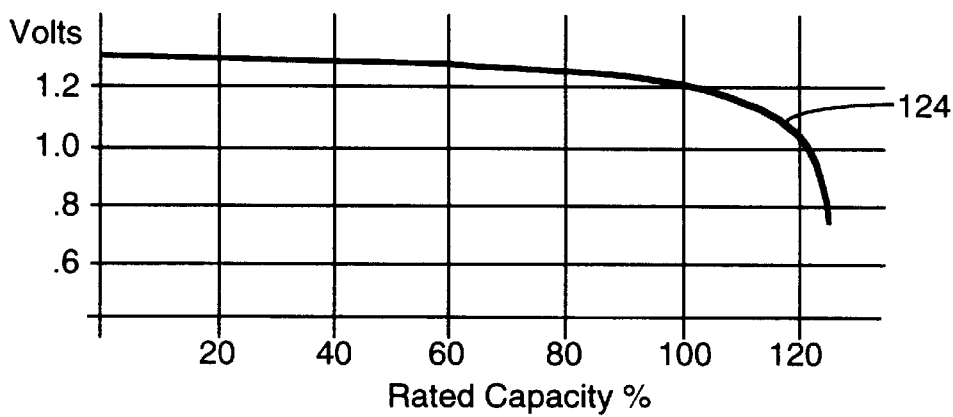
Figure 9A:
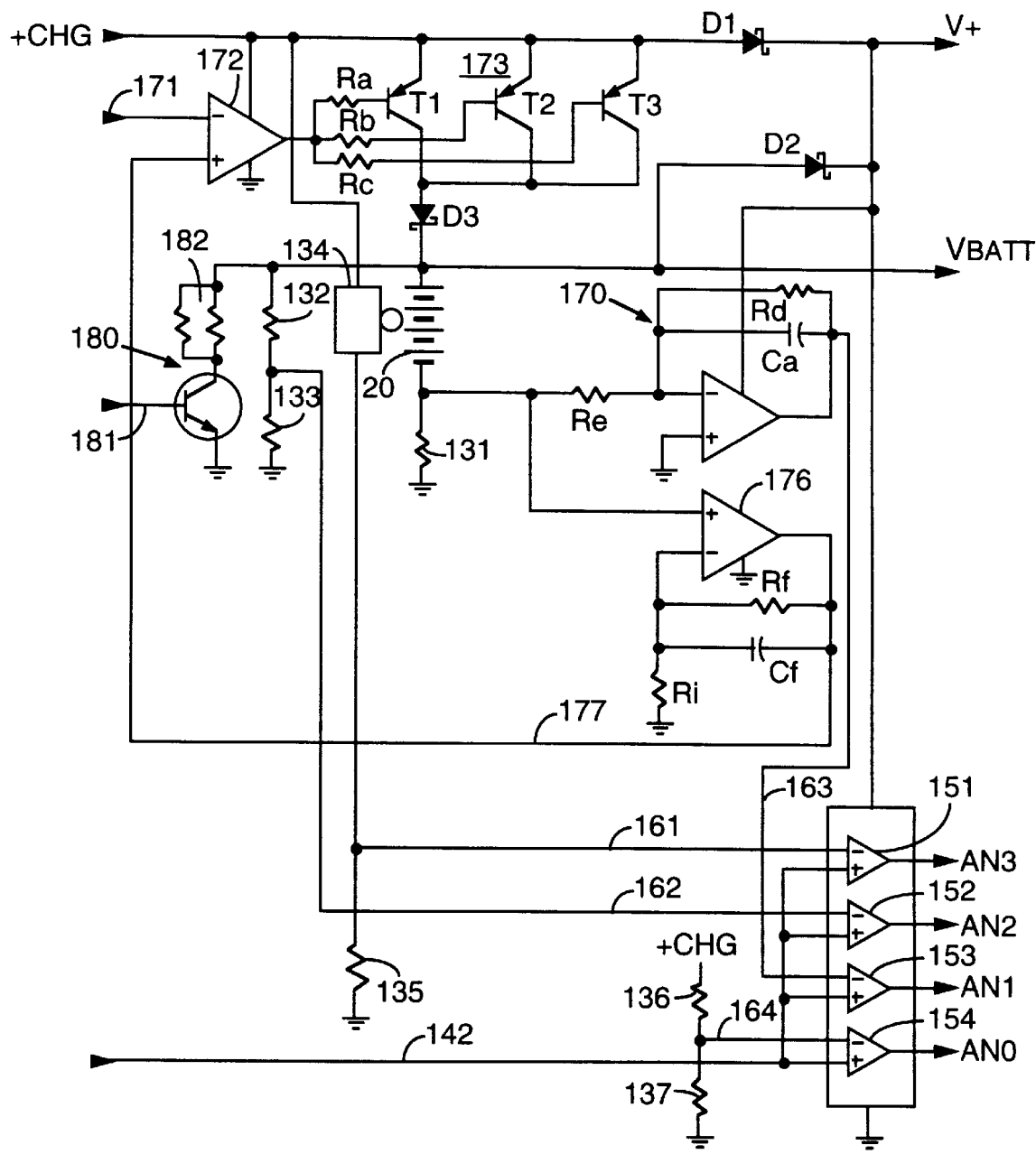
Figure 9B:
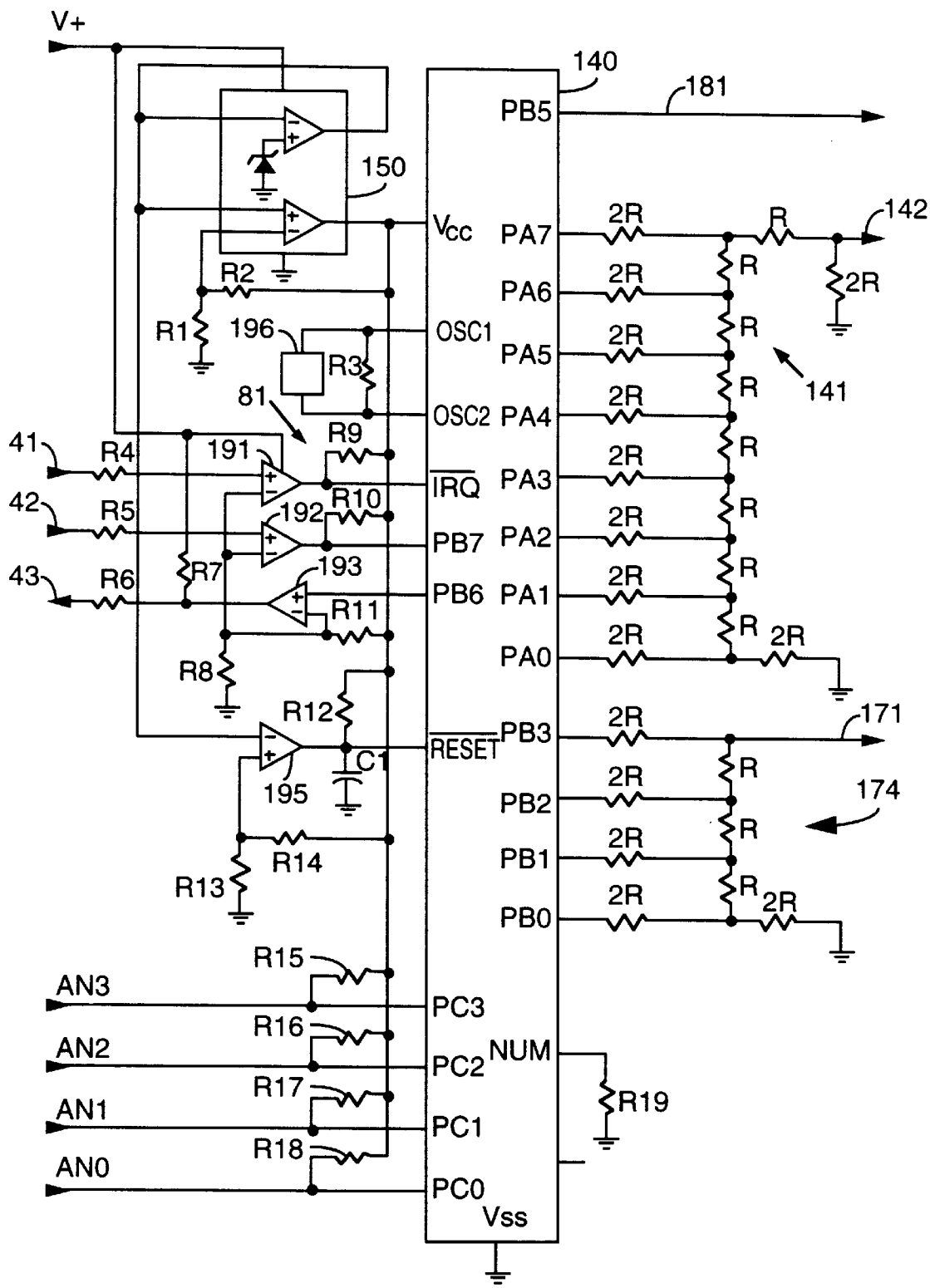
Figure 10:
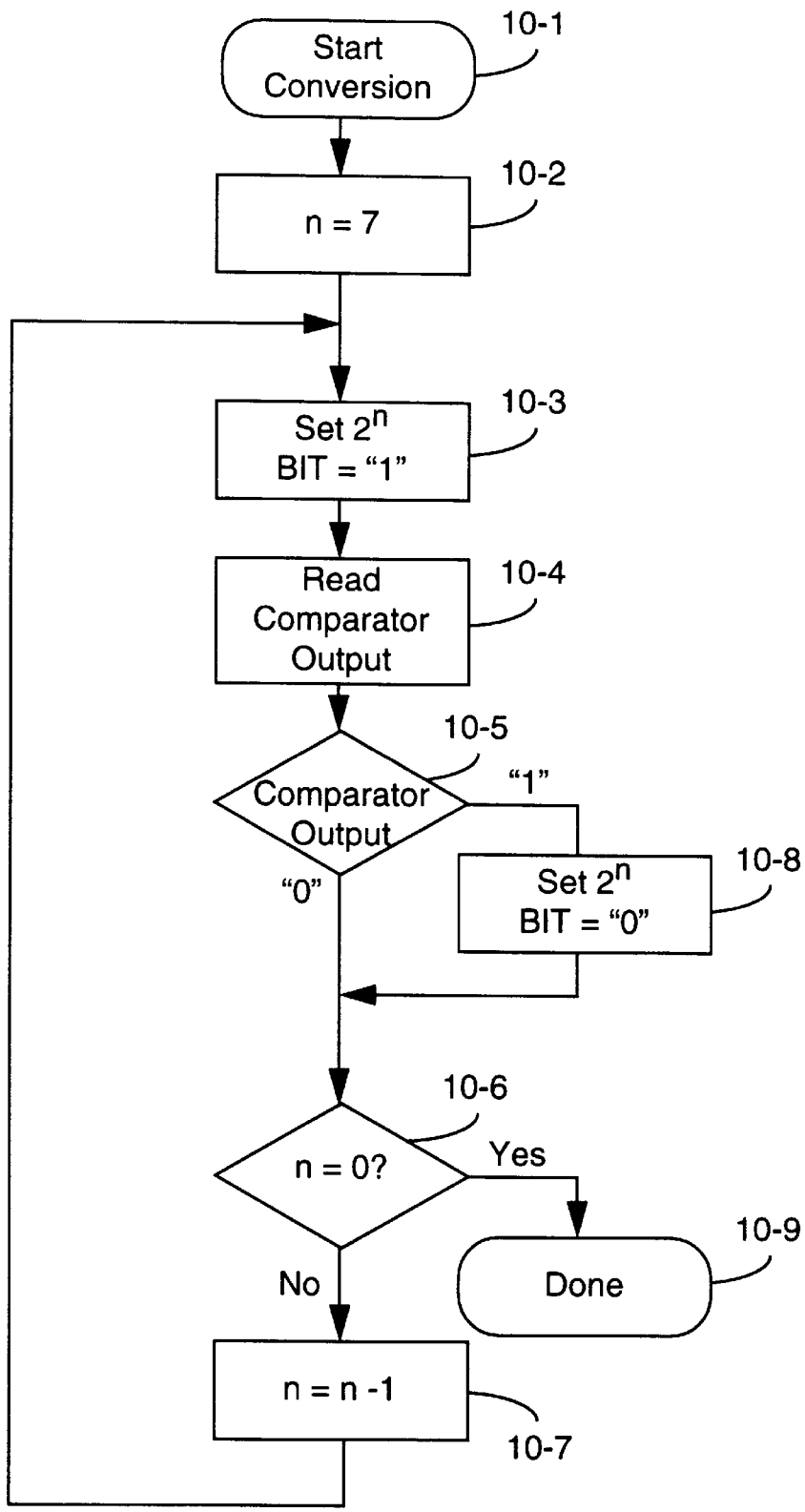
Figure 11:
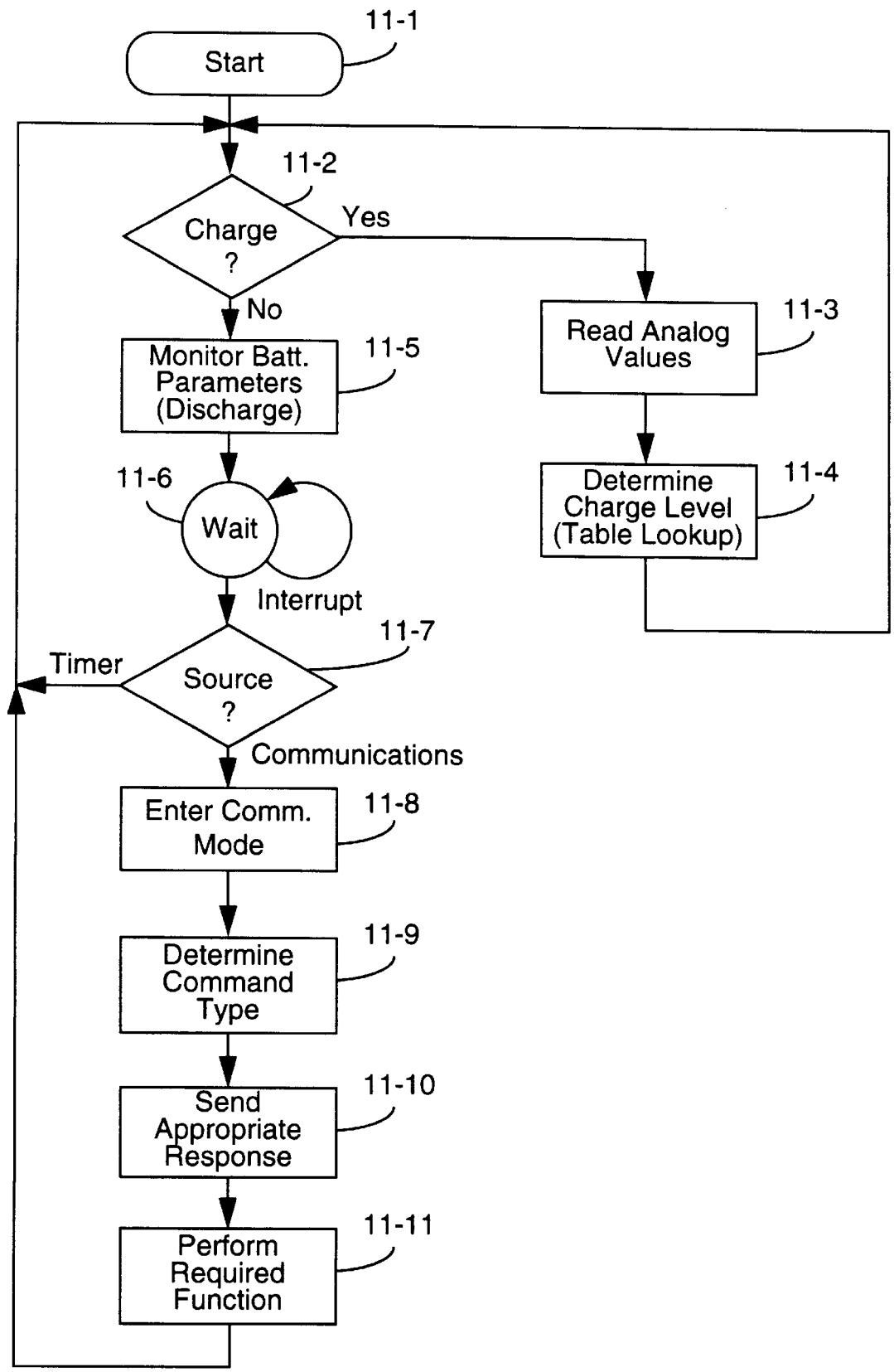
Figure 12:
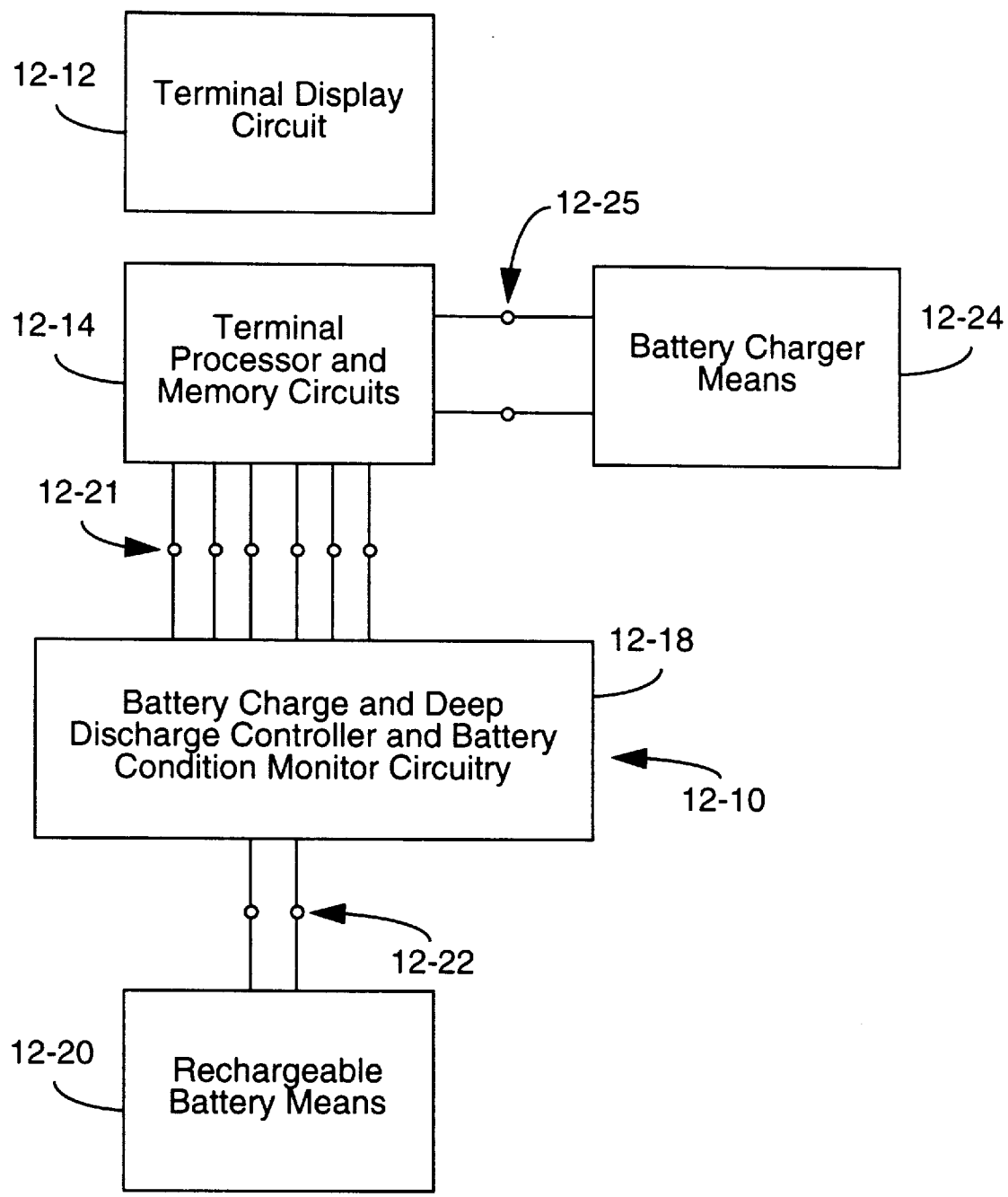
Figure 13:
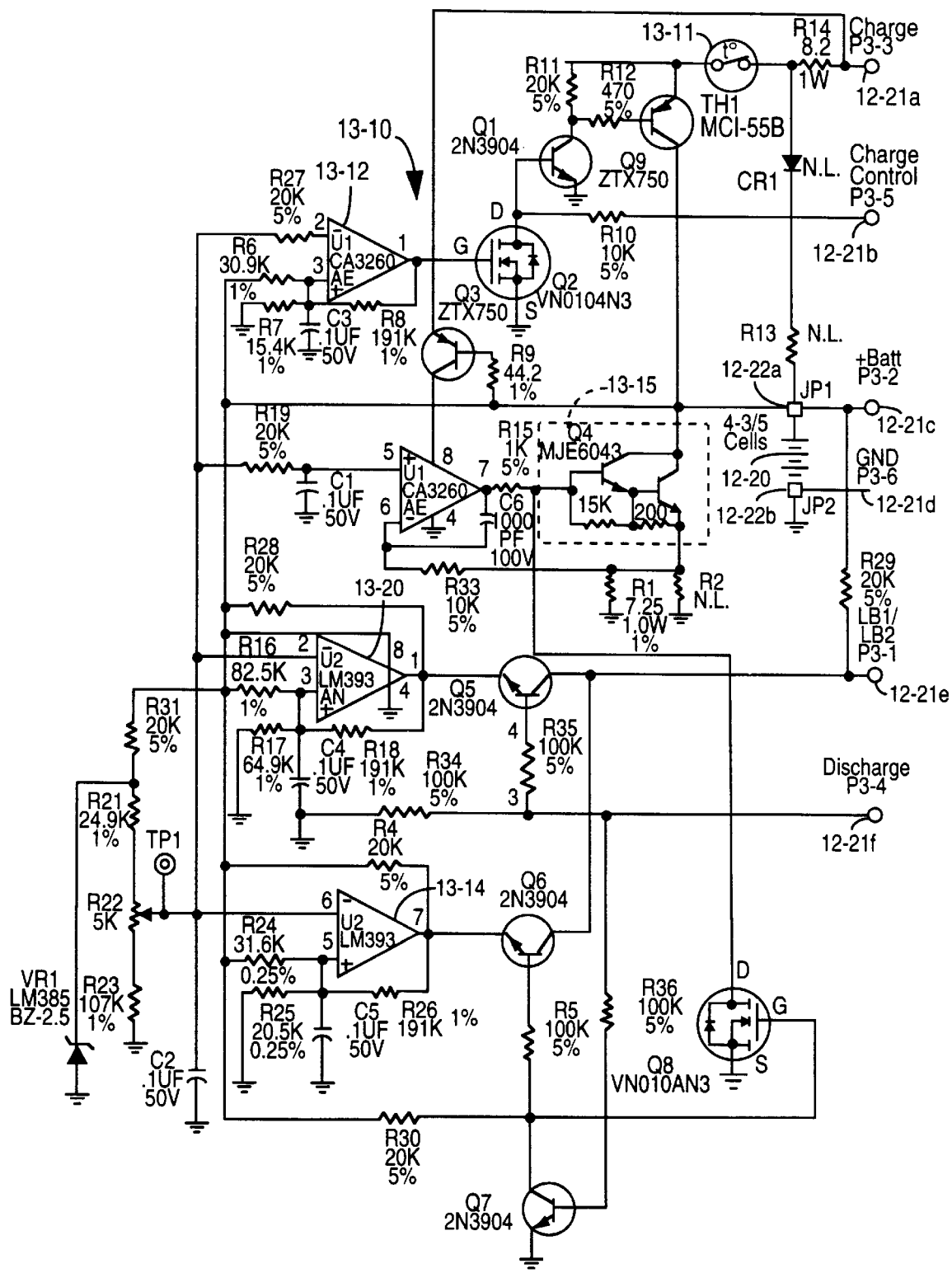
Figure 14:
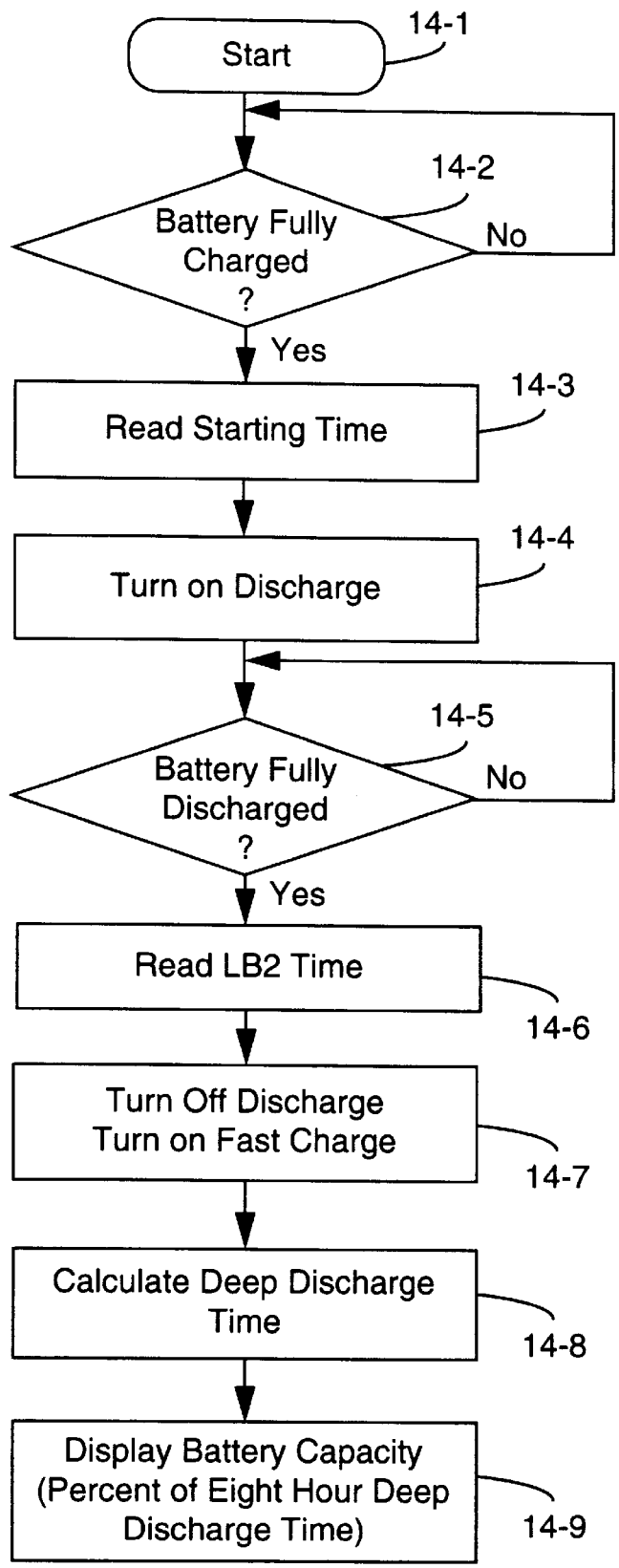
Figure 15:
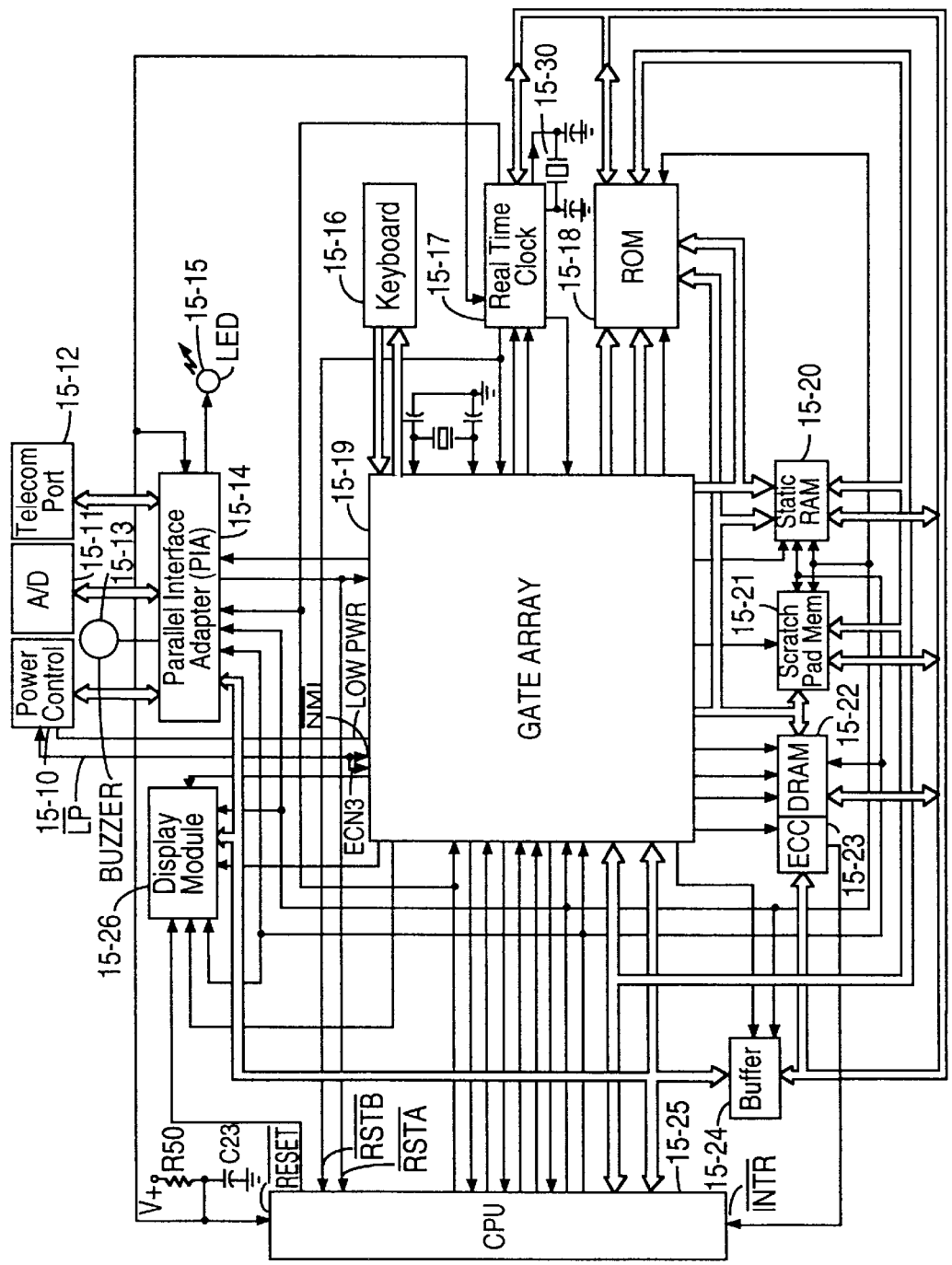
Figure 16A:
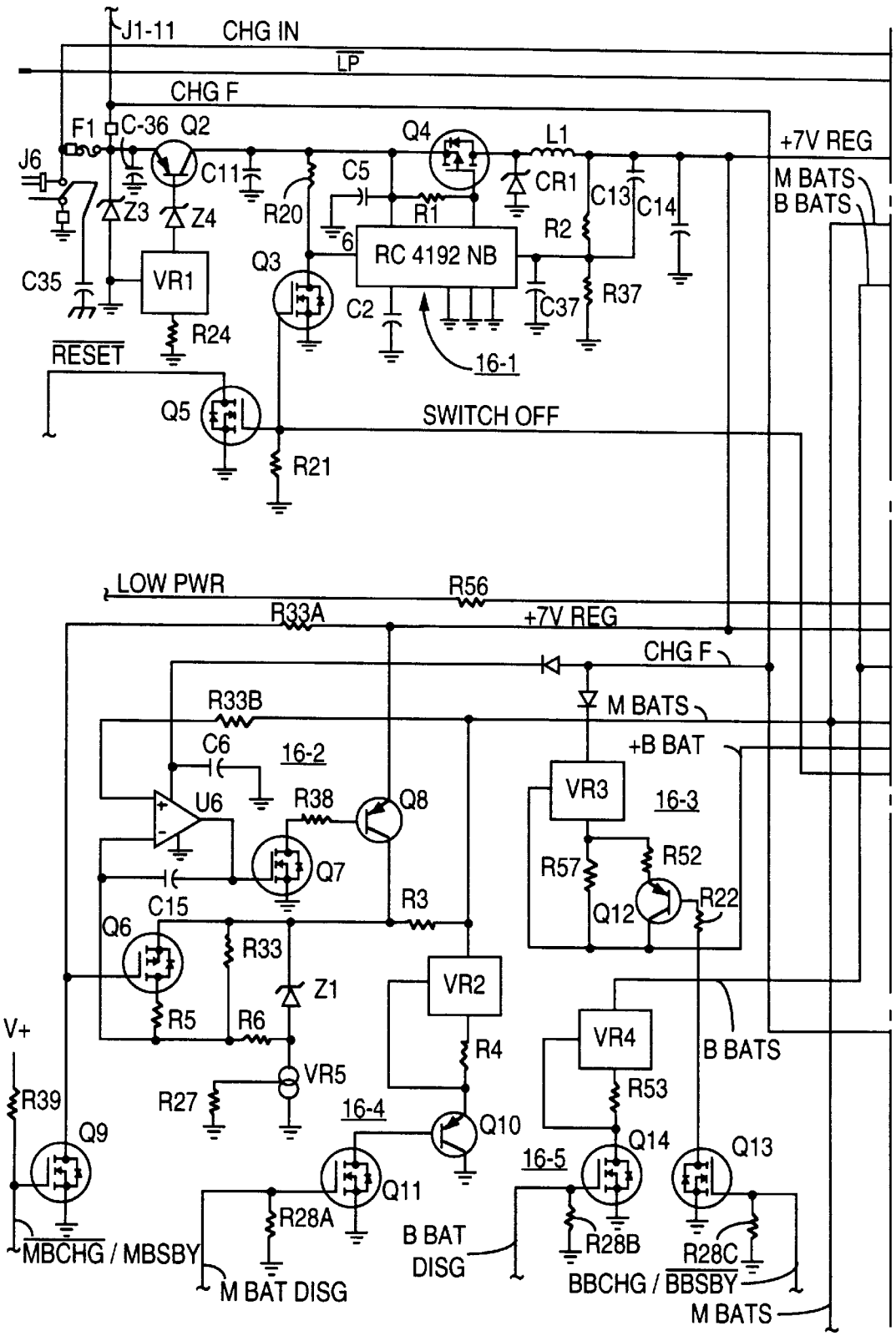
Figure 16B:
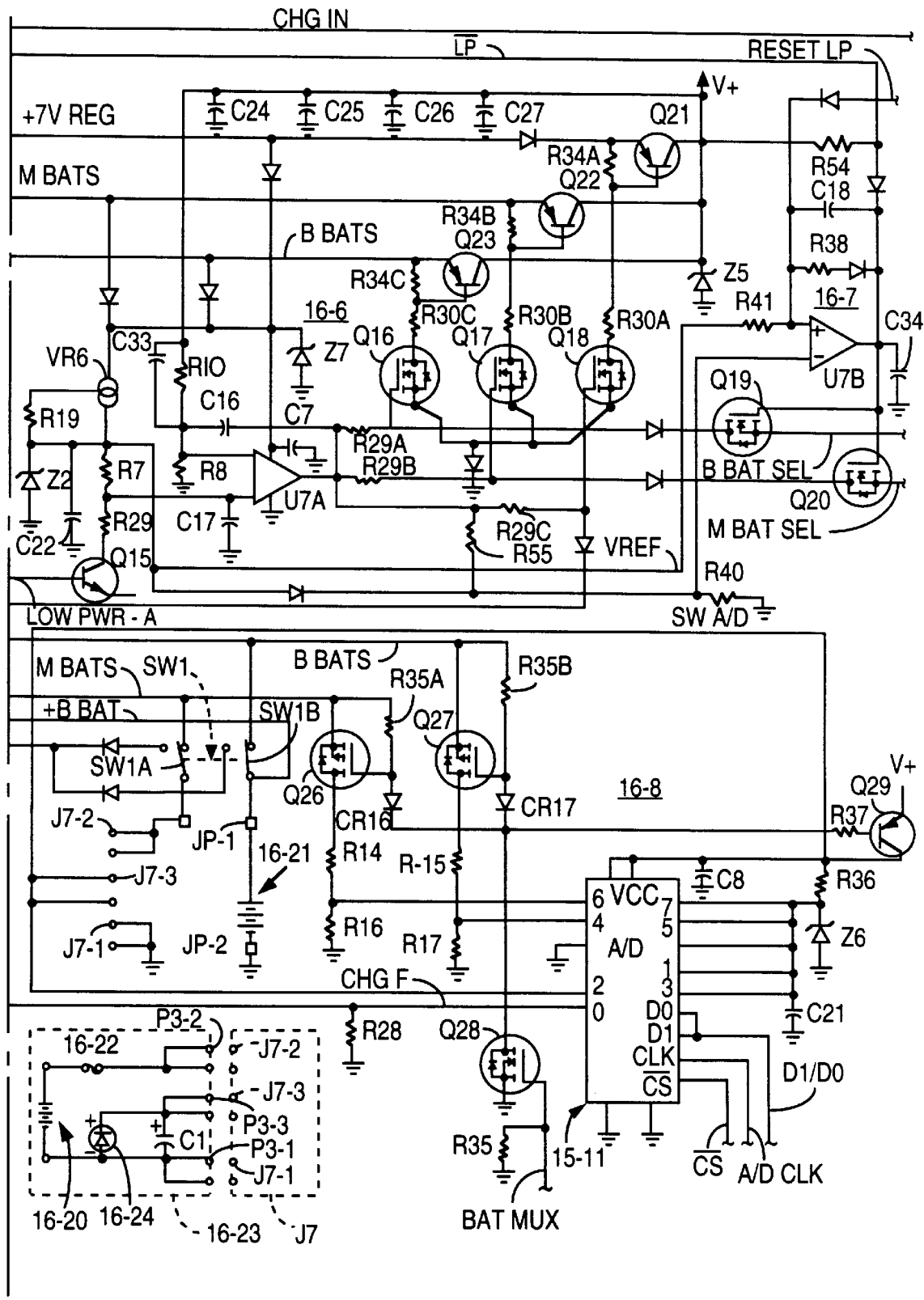
Figure 17:
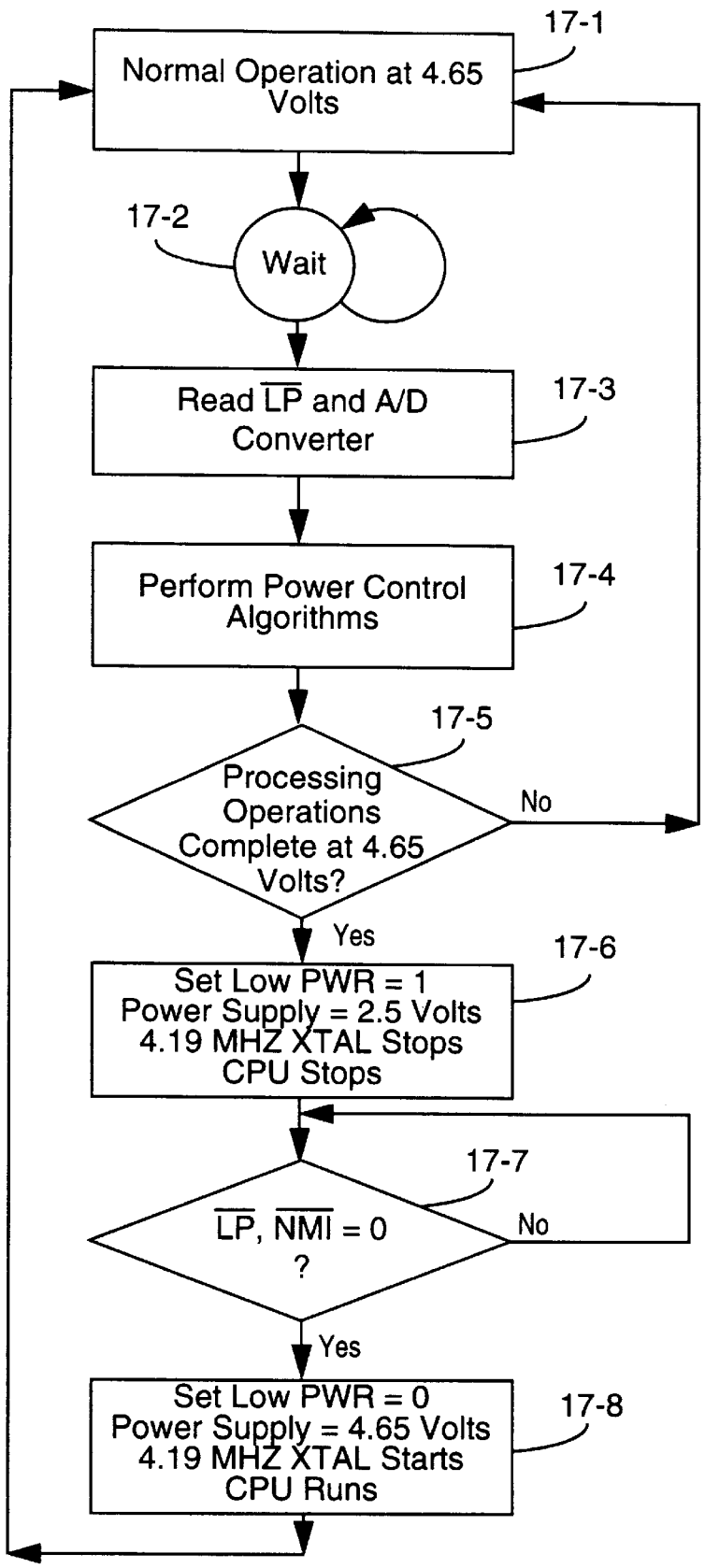
Figure 18:
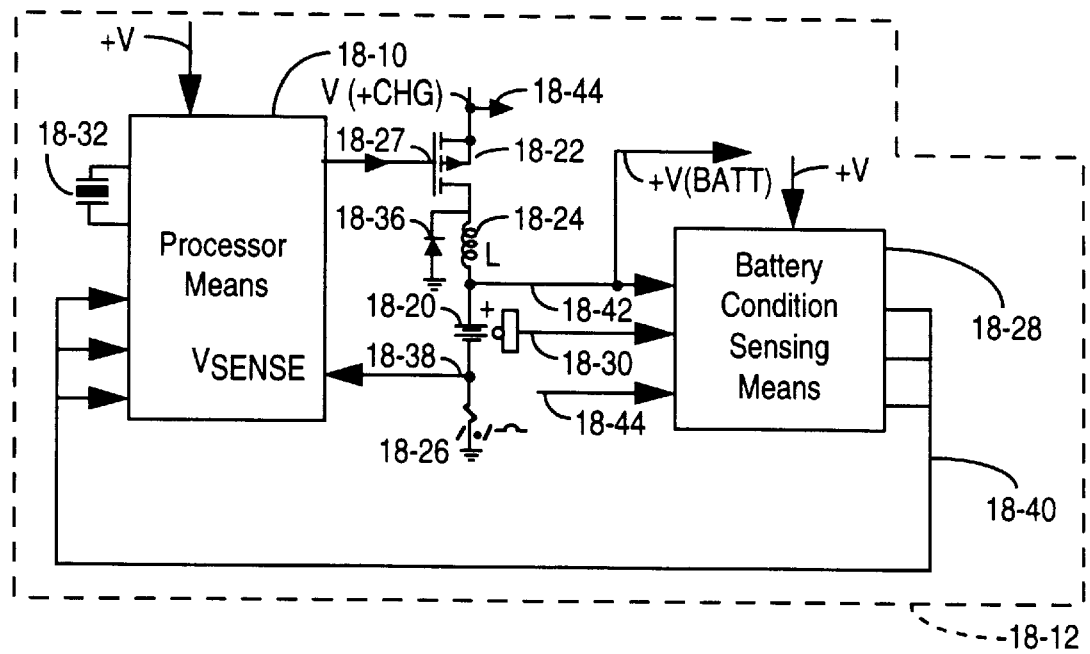
FIGS. 18–19, 20A–20B, and 21–27 and the brief description thereof are incorporated herein by reference to U.S. Ser. No. 07/769,337, now U.S. Pat. No. 5,278,487 issued Jan. 11, 1994.
Figure 19:
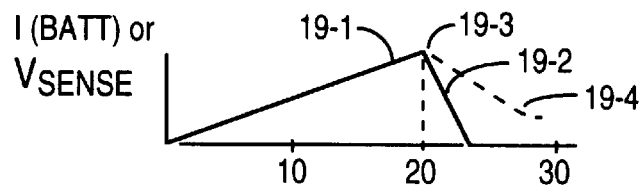
Figure 20A:
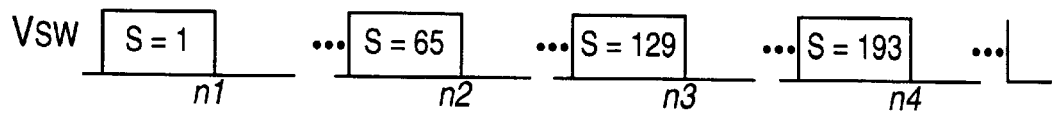
Figure 20B:
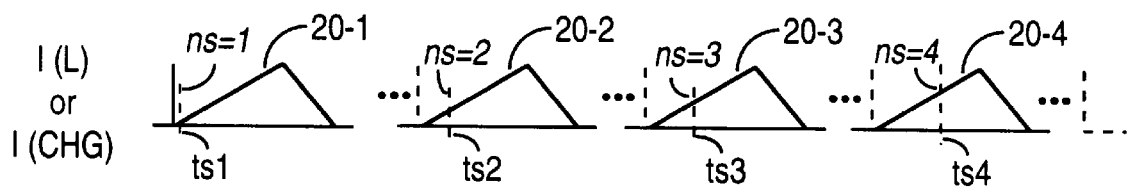
Figure 21:
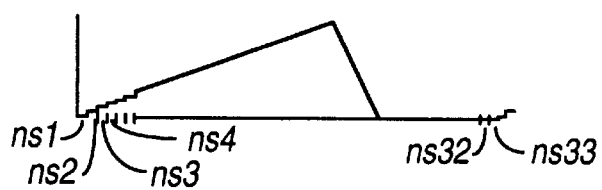
Figure 22:
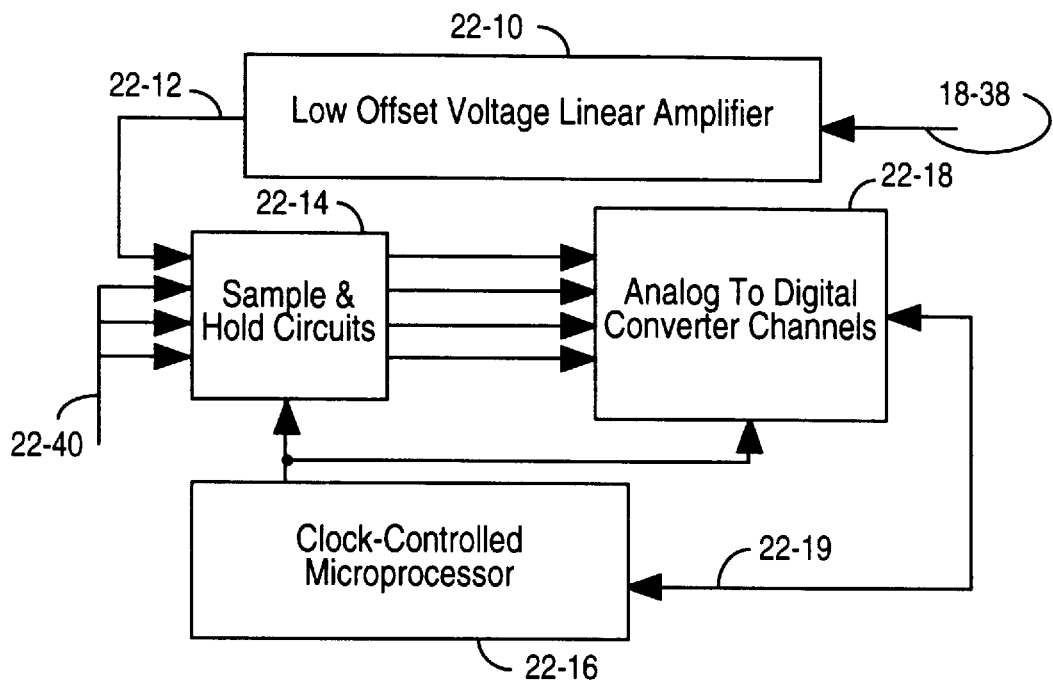
Figure 23:
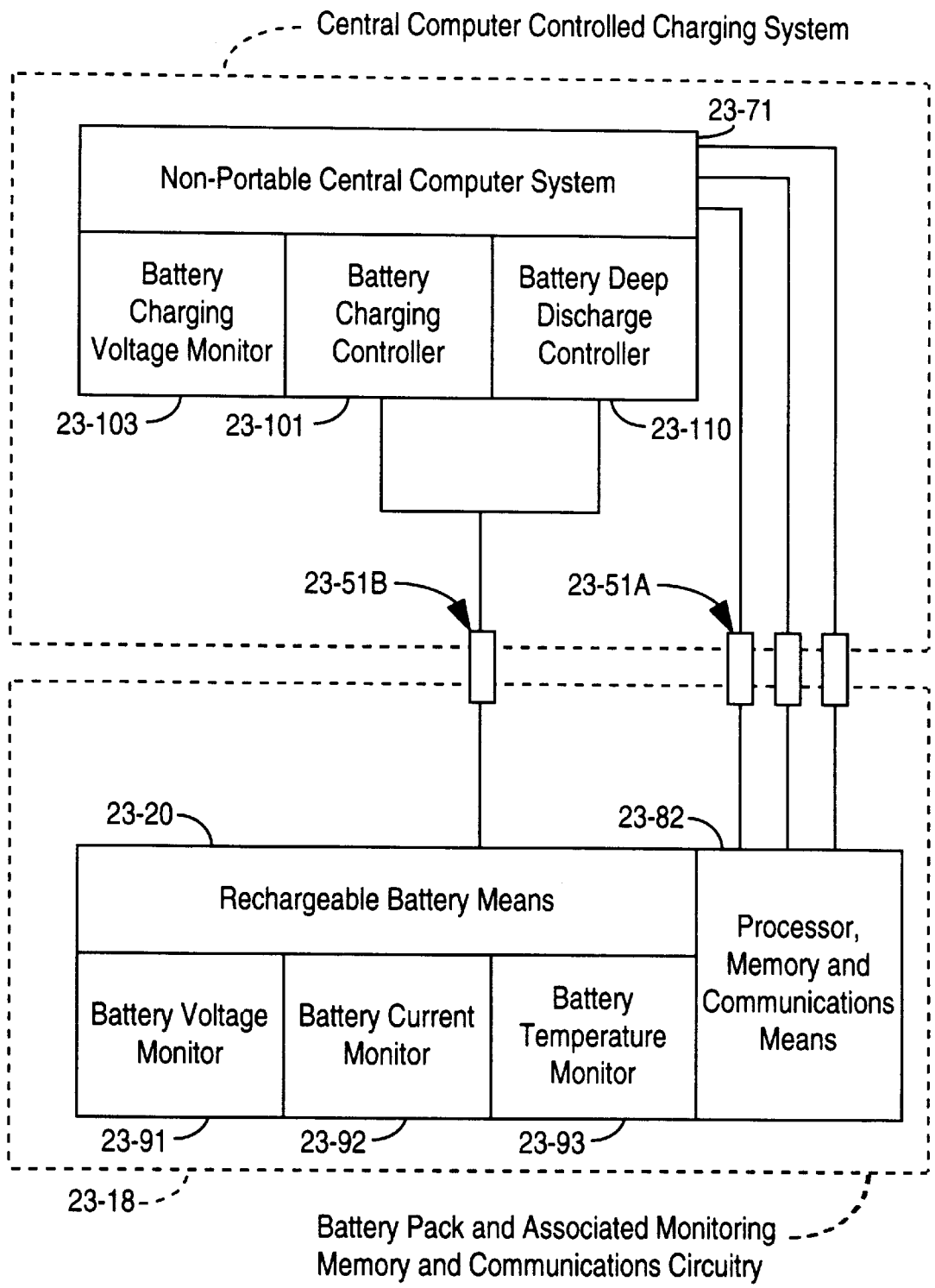
Figure 24:
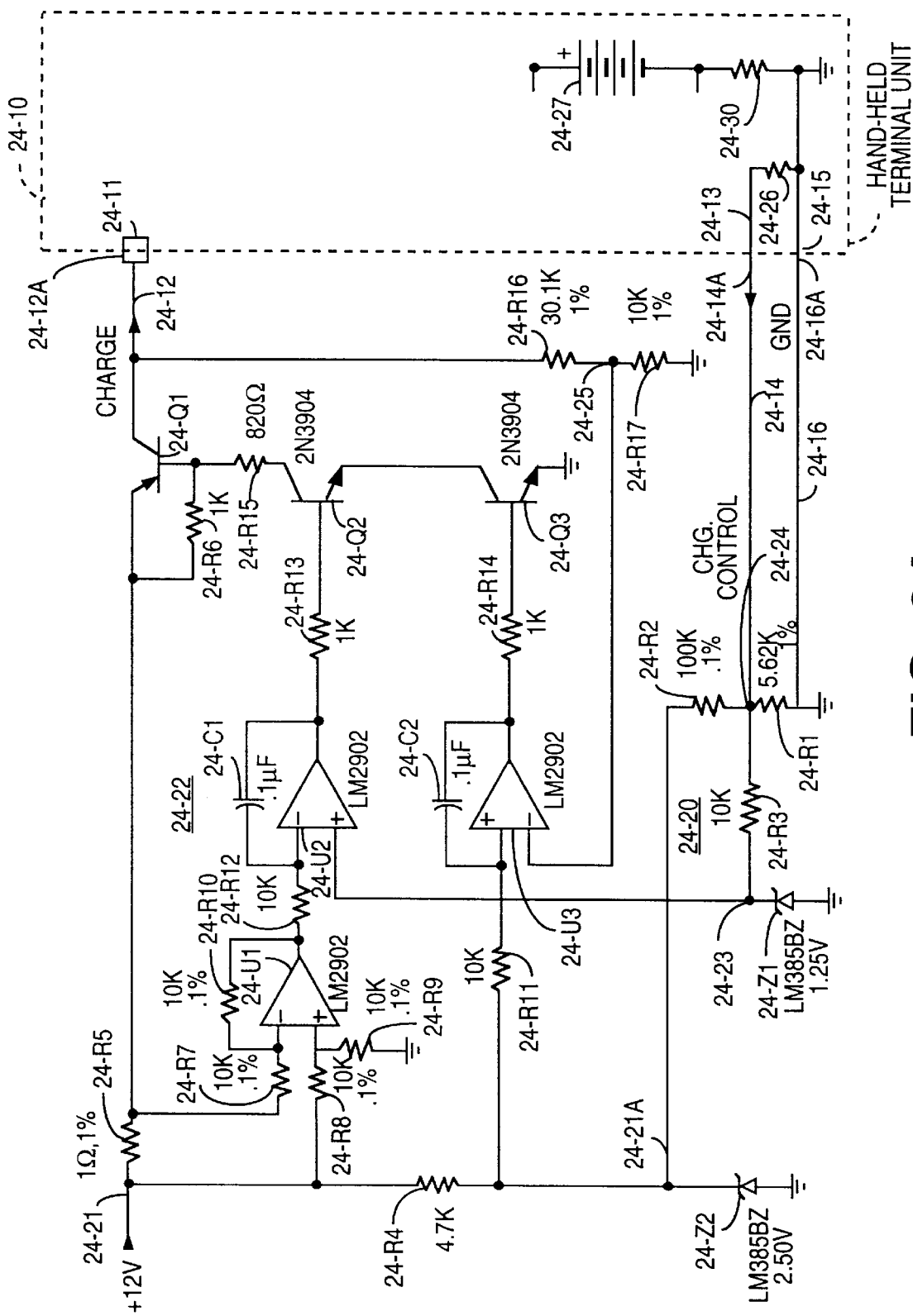
Figure 25:
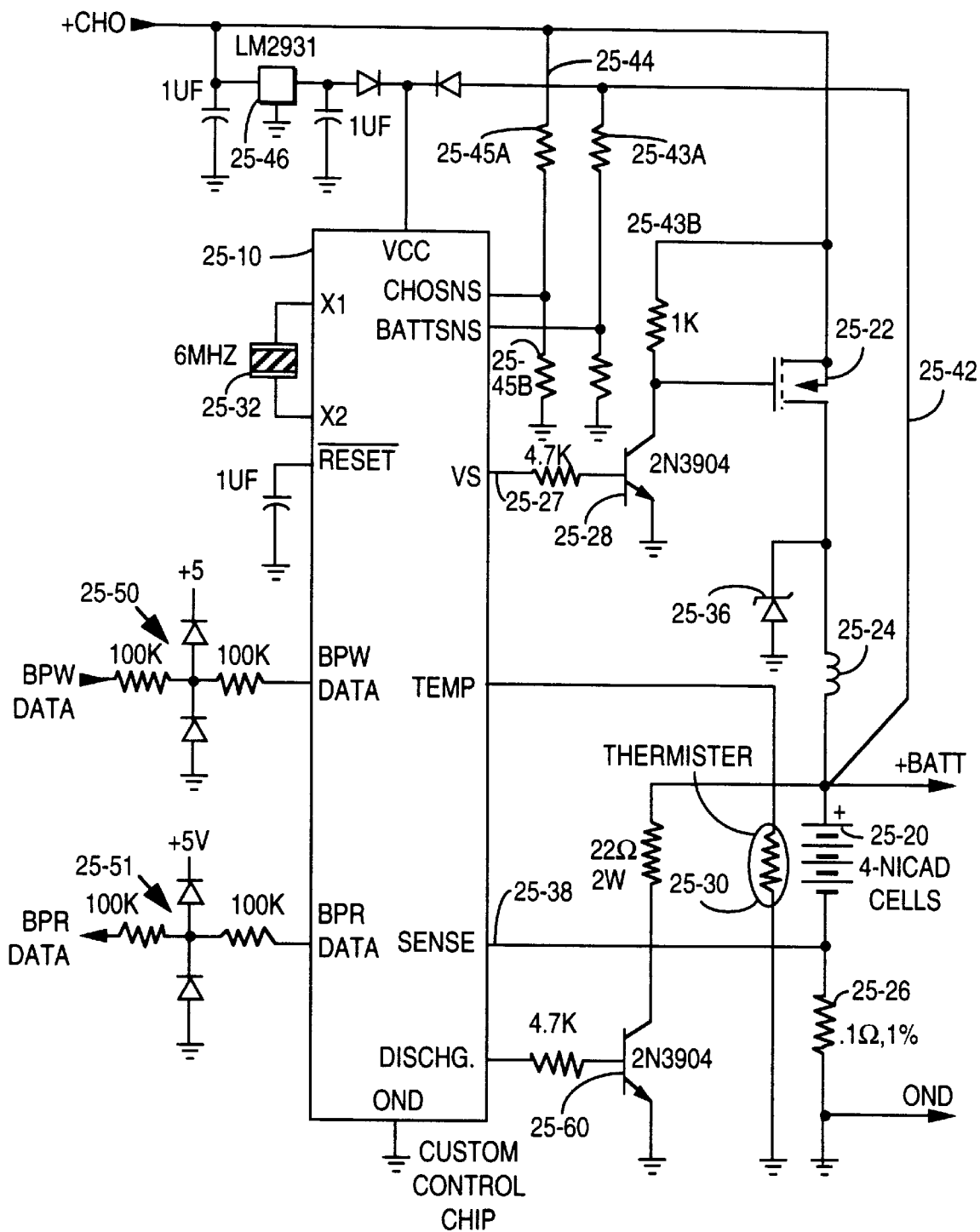
Figure 26:
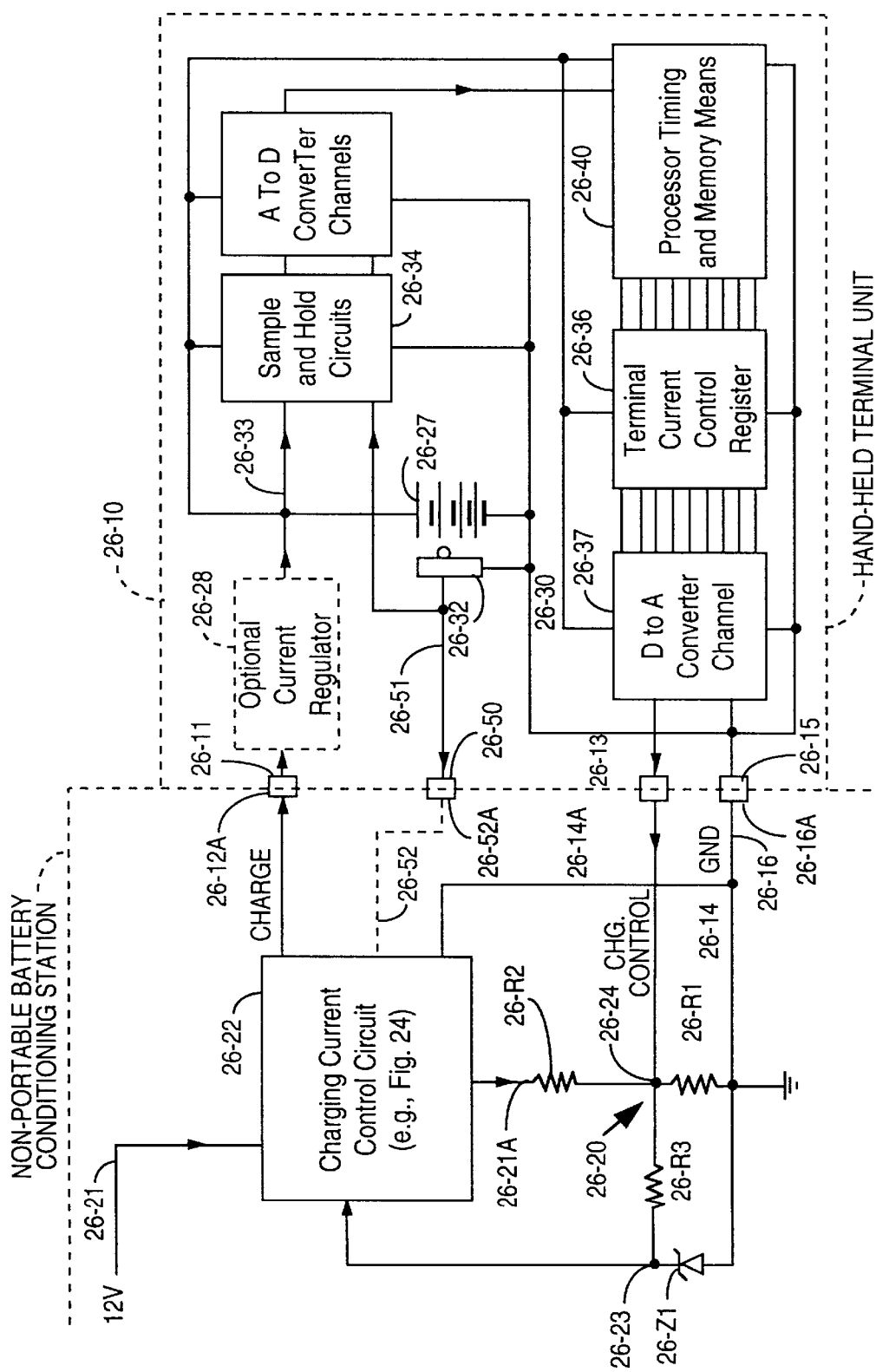
Figure 27:
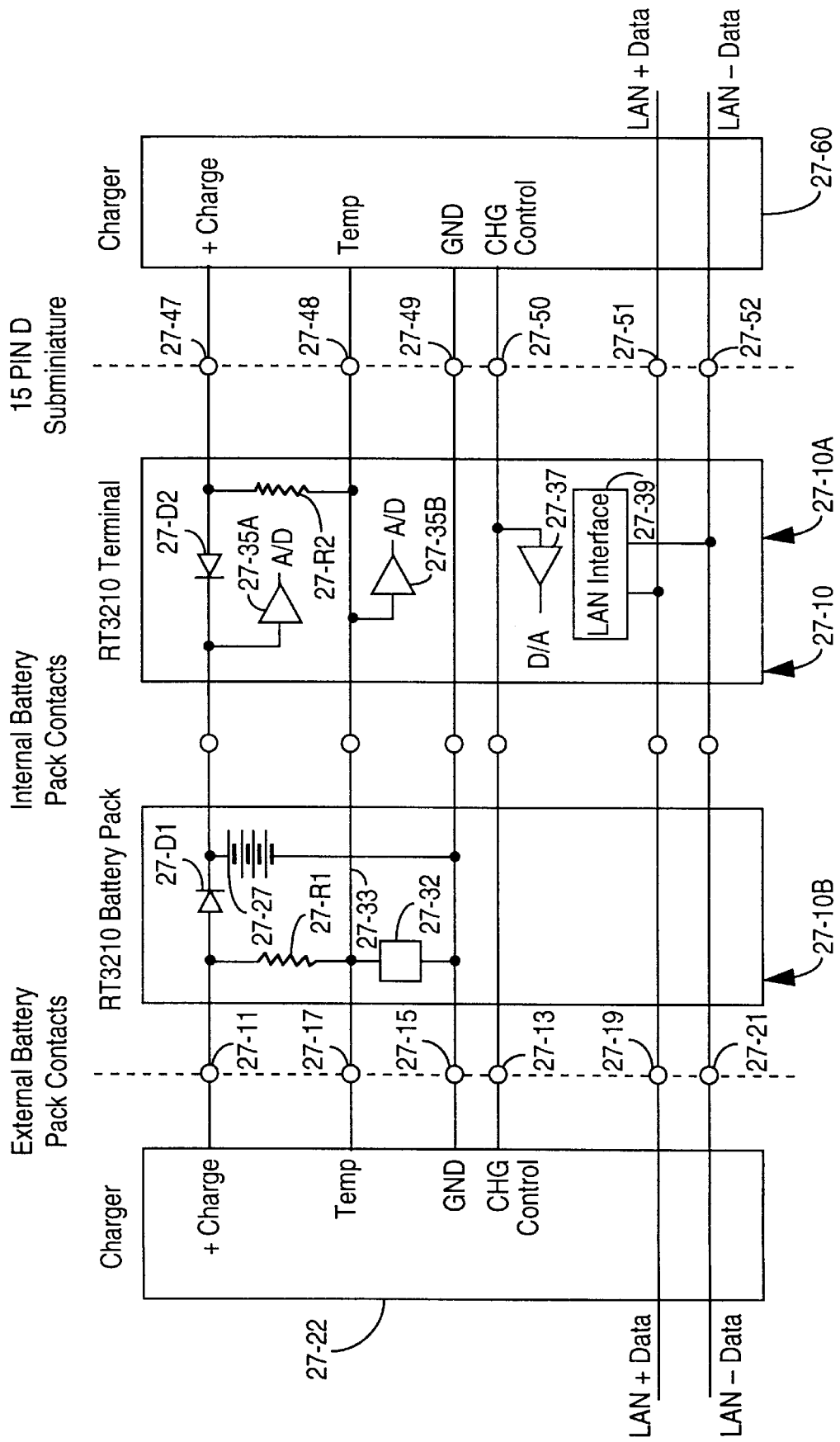
Figure 28:
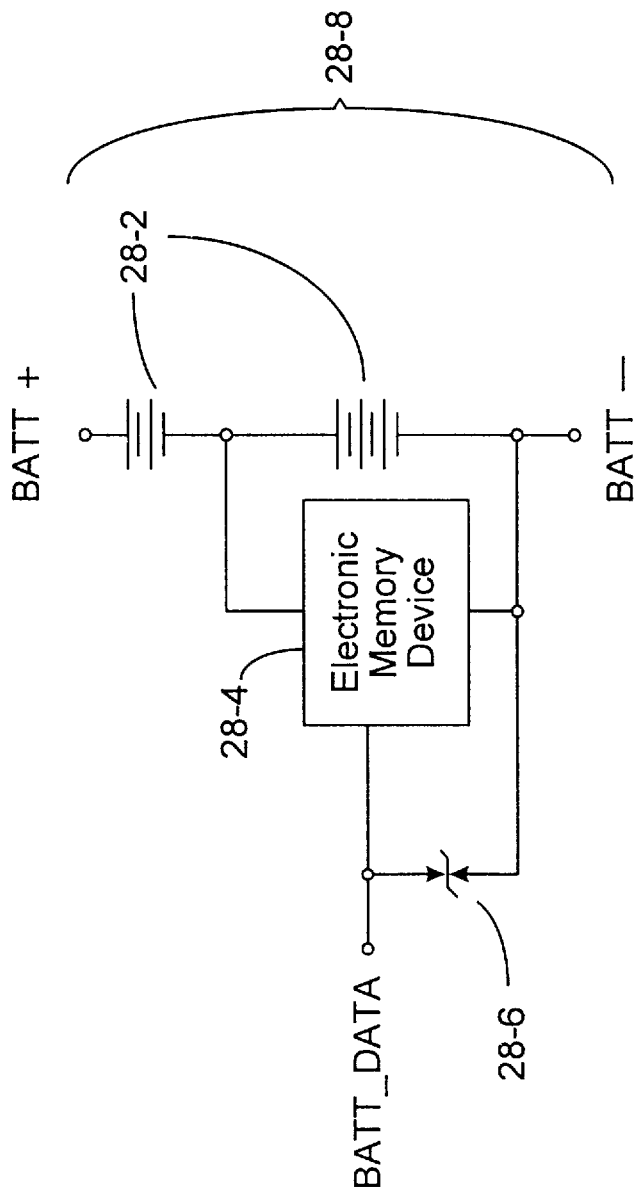
FIG. 28 depicts the electrical circuit arrangement of an exemplary battery pack having memory.

FIG. 28 illustrates the circuit arrangement of an exemplary data pack having memory 28-8. A number of electrochemical cells 28-2 are arranged in series to provide a predetermined voltage for powering a particular utilization device (not shown). In a preferred embodiment the electrochemical cells 28-2 are nickel-metal hydride cells of the type generally used for portable electronic equipment. Alternatively, the electrochemical cells may be nickel-cadmium cells, lithium-ion cells, or the like. In a preferred embodiment, five cells may be electrically arranged in series resulting in a positive battery voltage terminal BATT+ and a negative battery voltage terminal BATT-.

An electronic memory device 28-4 receives power from the electrochemical cells. The electronic memory device 28-4 is capable of storing information of the particular history of the battery pack 28-8 which may be later retrieved and acted upon accordingly by a utilization device. The electronic memory device 28-4 may store identification information such as manufacturer, date of manufacture, date of sale, serial number, type of electrochemical cells, chain of title from manufacturer to buyer, etc. for tagging and identifying that individual battery pack 28-8. Such information may be useful for example to trace the origin of defects or to determine the age of the battery pack, for example. Information as to the actual charging and discharging characteristics of the battery pack 28-8 may also be stored for determining the amount of available capacity remaining in the battery pack 28-8 or for optimizing recharging algorithms. The battery pack 28-8 history may include information such as maximum available capacity, remaining capacity, the total number of charge/discharge cycles the battery pack 28-8 has experienced, the number of charge/discharge cycles since a conditioning cycle, particular charge/discharge characteristics of the battery pack 28-8, battery temperature, or the like. The actual physical characteristics of the electrochemical cells may thus be monitored and stored in the electronic memory device and retrieved by the utilization device to effectively manage and employ the energy stored in the battery pack 28-8.

An ideal electronic memory device 28-4 consumes little or no power, is reliable, and is manufactured in a small package. In a preferred embodiment of the invention the electronic memory device 28-4 may be a Dallas Semiconductor DS2434 Battery Identification Chip. The DS2434 is manufactured in a 3 lead TO-92 package having two power leads and a 1-wire data interface lead. The DS2434 has 96 bytes of random access memory (RAM) and 32 bytes of nonvolatile EEPROM memory available for battery storage, includes a digital temperature sensor, and operates at low power. A utilization device may access the battery pack 28-8 data stored in the electronic memory device through the 1-wire interface at communications line BATT_DATA.

Operational power of the electronic memory device 28-4 may be supplied by the electrochemical cells 28-2 when the battery pack 28-8 is charged or by an external power source during charging. The nonvolatile memory of the electronic memory device 28-4 allows for retention of stored data in the event that the battery pack 28-8 is completely depleted. The electronic memory device 28-8 may be powered by fewer than the total number of electrochemical cells 28-2 in the battery pack 28-8 when the total series voltage from the entirety of the electrochemical cells 28-2 exceeds the maximum operating-voltage of the electronic memory device. In an exemplary embodiment employing five nickel-metal hydride electrochemical cells 28-2 the electronic memory device 28-6 may be powered by three of the electrochemical cells 28-2 by tapping an intermediate voltage point in the battery pack 28-8.

A voltage clamping component 28-4 may be utilized to protect the memory device 28-6 from accidental loss of stored memory states due to electrostatic discharge. For example an operator may touch communications terminal BATT_DATA during installation of the battery pack 28-8 into a utilization device and inadvertently apply an electrostatic discharge through the communications terminal BATT_DATA to the electronic memory device 28-4 thereby destroying the stored memory states and causing a loss of the stored battery pack 28-8 data. The voltage clamping component 28-6 may be an AVX Transguard type component connected between communications line BATT_DATA and negative terminal BATT- of the battery pack 28-8 which is typically a ground reference. The voltage clamping component 28-6 clamps any high voltage transient occurring at the BATT_DATA terminal in order to prevent damage to the electronic memory device 28-4.

Figure 29:
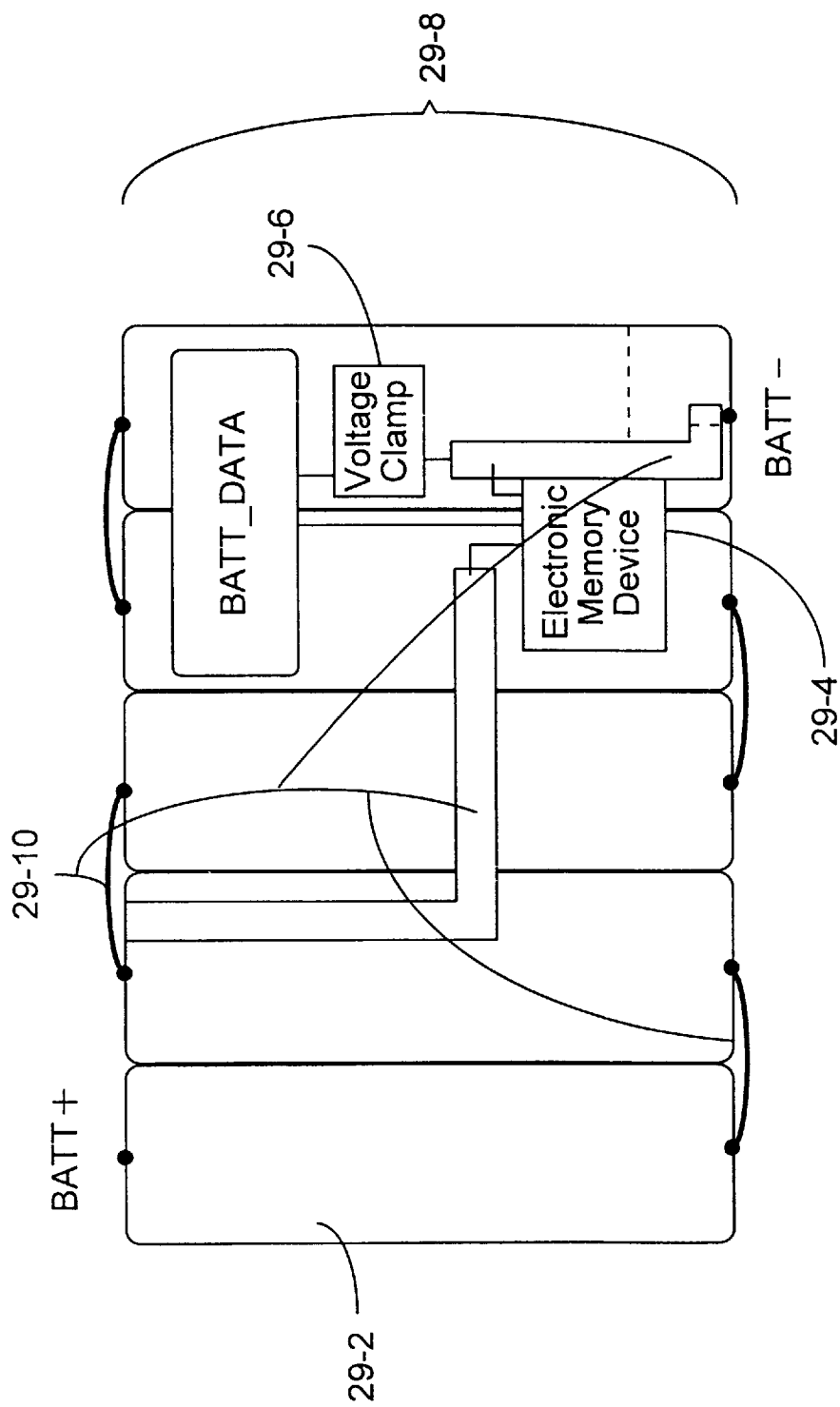
FIG. 29 shows a physical arrangement of the components of the battery pack having memory in an exemplary manufacture of the invention.

FIG. 29 depicts a physical configuration of the battery pack 29-8 as manufactured. The battery pack 29-8 may be assembled using the process normally employed to assemble rechargeable battery packs wherein thin metal straps 29-10 are spot welded to the electrochemical cells 29-2 to interconnect the electrochemical cells 29-2. Using standard battery pack assembly techniques provides reliable low impedance and low cost connections within the battery pack 29-8. No circuit board nor any other components which may increase manufacture costs and reduce the reliability of the connections are needed to assemble the battery pack 29-8.

Communications line BATT_DATA requires a large area contact pad as shown in FIG. 29 for optimum signal integrity. The straps 29-10 may be comprised of individual pieces of metal an maybe placed on an insulating substrate to hold them in the proper orientation for assembly. Metal pieces 29-10 may be formed by chemical etching from a single sheet of material which may consist of a traditional flexible circuit or an equivalent thereof.

The spot welding process may be a possible source of damage to-the electronic memory device 29-4 due to the application of a potentially damaging high voltage on the pins of the electronic memory device 29-4 by the spot welder. The potentially damaging effects of spot welding to the electronic memory device 294 may be mitigated or eliminated by assembling the voltage clamping 29-6 device to the battery pack 29-8 assembly prior to attaching the electronic memory device. The electronic memory device 29-4 and the voltage clamping component 29-6 may be affixed to metal conductors 29-10 using a traditional electrical connection technique such as soldering before the spot weld is applied. Once the electronic component 294 and the voltage clamping device 29-6 are affixed to metal conductors 29-10, metal conductors 29-10 may be mechanically clamped to a low electrical potential point such that no damaging voltage will be applied to the pins of the electronic memory device.

In view of the above detailed description of a preferred embodiment and modifications thereof, various other modifications will now become apparent to those skilled in the art. The claims below encompass the disclosed embodiments and all the reasonable modifications and variations without departing from the spirit and scope of the invention.

I claim:

1. A battery powered electronic system comprising:
   (a) a portable battery powered utilization device for operating from battery power during portable operation thereof, said utilization device having a first plurality of conductors and a device processor; and
   (b) a removable battery pack having memory, a battery processor, and a second plurality of conductors, said utilization device adapted to receive said removable battery pack in an assembled relationship wherein the first and second plurality of conductors contact to provide at least power and communication paths between said removable battery pack and said utilization device for supplying operating power and battery data from said removable battery pack to said utilization device, said removable battery pack and said utilization device together being of size and weight to be carried by an individual person.

2. The battery powered electronic system according to claim 1 wherein said battery pack having memory comprises:
   (a) a plurality of electrochemical cells for providing power to said utilization device at a first voltage;
   (b) an electronic memory device having a communications interface for communicating battery data to said utilization device wherein said electrochemical cells power said memory device at a second voltage; and
   (c) a voltage clamp operatively connected to said communications interface for protecting said electronic memory device from electrostatic discharge.

3. The battery pack having memory of claim 2 wherein said electronic memory device includes volatile memory.

4. The battery pack having memory of claim 2 wherein said electronic memory device includes nonvolatile memory.

5. The battery pack having memory of claim 2 wherein said electronic memory system includes a combination of volatile and nonvolatile memory.

6. A battery powered electronic system comprising:
   (a) a portable battery powered utilization device having a first plurality of conductors and a device processor; and
   (b) a removable battery pack having a battery processor and a second plurality of conductors, said utilization device adapted to receive said removable battery pack in an assembled relationship wherein the first and second plurality of conductors contact to provide at least a power path between said removable battery pack and said utilization device and a communication path between said battery processor and said device processor, said utilization device receiving operating power for portable operation and battery data from said removable battery pack via said power and communication paths, said removable battery pack and said utilization device together being of size and weight to be carried by an individual person.

7. The battery powered electronic system of claim 6 wherein the removable battery pack further comprises a printed circuit board and a plurality of electrochemical cells operatively coupled to the printed circuit board.

8. The battery powered electronic system of claim 6 wherein the removable battery pack further comprises a memory device.

9. The battery powered electronic system of claim 7 wherein the removable battery pack further comprises a memory device, and wherein the memory device is operatively coupled with the printed circuit board.

10. A battery powered electronic system comprising:
    (a) a portable battery powered utilization device having a first plurality of conductors and a device processor; and
    (b) a removable battery pack having memory, a battery processor, a second plurality of conductors, and a plurality of electrochemical cells, at least one of said plurality of electrochemical cells providing operating power to said memory and said battery processor, said utilization device receiving said removable battery pack in an assembled relationship wherein the second plurality of conductors contact the first plurality of conductors thereby operatively coupling the plurality of electrochemical cells with the utilization device for supplying operating power thereto, and thereby communicatively coupling at least one of the memory and the battery processor with the device processor for supplying battery data thereto, said removable battery pack and said utilization device together being of size and weight to be carried by an individual person.

* * * * *

(12) EX PARTE REEXAMINATION CERTIFICATE (6413th)
United States Patent
Koenck

(10) Number: US 5,883,493 C1
(45) Certificate Issued: Sep. 2, 2008

(54) BATTERY PACK HAVING MEMORY

(75) Inventor: Steven E. Koenck, Cedar Rapids, IA (US)

(73) Assignee: Unova, Inc., Woodland Hills, CA (US)

Reexamination Request:
No. 90/007,886, Jan. 20, 2006

Reexamination Certificate for:
Patent No.: 5,883,493
Issued: Mar. 16, 1999
Appl. No.: 08/841,974
Filed: Apr. 8, 1997

Related U.S. Application Data

(63) Continuation of application No. 08/415,075, filed on Mar. 30, 1995, now Pat. No. 5,619,117, which is a continuation-in-part of application No. 08/134,881, filed on Oct. 12, 1993, now Pat. No. 5,508,599, which is a continuation of application No. 07/769,337, filed on Oct. 1, 1991, now Pat. No. 5,278,487, which is a continuation of application No. 07/544,230, filed on Jun. 26, 1990, now abandoned, which is a division of application No. 07/422,226, filed on Oct. 16, 1989, now Pat. No. 4,961,043, which is a division of application No. 07/168,352, filed on Mar. 15, 1988, now Pat. No. 4,885,523, which is a continuation-in-part of application No. 06/944,503, filed on Dec. 18, 1986, now Pat. No. 4,737,702, which is a continuation-in-part of application No. 06/876,194, filed on Jun. 19, 1986, now Pat. No. 4,709,202, which is a division of application No. 06/797,235, filed on Nov. 12, 1985, now Pat. No. 4,716,354, which is a continuation-in-part of application No. 06/612,588, filed on May 21, 1984, now Pat. No. 4,553,081, which is a continuation-in-part of application No. 06/385,830, filed on Jun. 7, 1982, now Pat. No. 4,455,523.

(51) Int. Cl.
*H02J 7/00* (2006.01)
*H02J 9/06* (2006.01)
*H01M 10/48* (2006.01)
*H01M 2/10* (2006.01)
*H01M 10/42* (2006.01)
*H01M 6/00* (2006.01)
*H01M 2/20* (2006.01)
*H01M 6/50* (2006.01)
*G06F 1/26* (2006.01)
*G01R 31/36* (2006.01)

(52) U.S. Cl. .................................... 320/114; 320/106
(58) Field of Classification Search .................. None
See application file for complete search history.

(56) References Cited

U.S. PATENT DOCUMENTS

| 3,599,071 A | 8/1971 | Enghlen et al. |
| 3,683,258 A | 8/1972 | Harbonn |
| 3,740,636 A | 6/1973 | Hogrete |
| 3,754,182 A | 8/1973 | Morris et al. |
| 3,763,416 A | 10/1973 | Jache |
| 3,771,132 A | 11/1973 | Biewer |
| 3,775,659 A | 11/1973 | Carlsen, II |
| 3,823,388 A | 7/1974 | Chadima, Jr. et al. |
| 3,843,967 A | 10/1974 | Mulvany |
| 3,911,350 A | 10/1975 | Swope |
| 3,917,990 A | 11/1975 | Sherman, Jr. |
| 3,921,050 A | 11/1975 | Rowas |
| 3,928,792 A | 12/1975 | Mullersman et al. |
| 3,941,989 A | 3/1976 | McLaughlin et al. |
| 3,956,740 A | 5/1976 | Jones et al. |
| 3,965,740 A | 6/1976 | Martig, Jr. |
| 3,969,667 A | 7/1976 | McWilliams |
| 3,971,980 A | 7/1976 | Jungfer et al. |
| 3,979,656 A | 9/1976 | Takeda et al. |
| 3,997,834 A | 12/1976 | Winter et al. |
| 4,001,550 A | 1/1977 | Schatz |
| 4,017,725 A | 4/1977 | Roen |
| 4,030,086 A | 6/1977 | Salem |
| 4,045,720 A | 8/1977 | Alexandres |
| 4,061,956 A | 12/1977 | Brown et al. |
| 4,072,859 A | 2/1978 | McWaters |
| 4,095,217 A | 6/1978 | Tani et al. |
| 4,118,661 A | 10/1978 | Siekierski et al. |
| 4,121,115 A | 10/1978 | De Mere |
| 4,125,802 A | 11/1978 | Godard |
| 4,127,803 A | 11/1978 | Etienne |
| 4,140,957 A | 2/1979 | Rapp |
| 4,143,417 A | 3/1979 | Wald et al. |
| 4,151,454 A | 4/1979 | Iida |
| 4,158,194 A | 6/1979 | McWaters et al. |
| 4,160,156 A | 7/1979 | Sherer |
| 4,163,120 A | 7/1979 | Baumwolspiner |
| 4,163,193 A | 7/1979 | Kamiya |
| 4,164,020 A | 8/1979 | Griffith |
| 4,173,733 A | 11/1979 | Sugalski et al. |
| 4,180,770 A | 12/1979 | Eby |

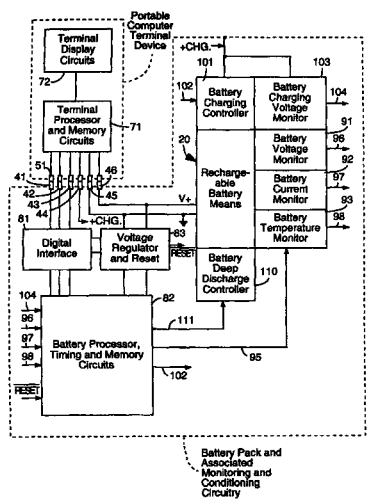

| Patent No. | Date | Inventor |
|---|---|---|
| 4,189,779 A | 2/1980 | Brantingham |
| 4,193,026 A | 3/1980 | Finger et al. |
| 4,203,103 A | 5/1980 | Osada et al. |
| 4,203,105 A | 5/1980 | Dragone et al. |
| 4,217,645 A | 8/1980 | Barry et al. |
| 4,227,837 A | 10/1980 | Yodoshi |
| 4,232,308 A | 11/1980 | Lee et al. |
| 4,237,411 A | 12/1980 | Kothe et al. |
| 4,247,908 A | 1/1981 | Lockhart, Jr. et al. |
| 4,251,883 A | 2/1981 | Grants et al. |
| 4,275,274 A | 6/1981 | English |
| 4,277,837 A | 7/1981 | Stuckert |
| 4,279,020 A | 7/1981 | Christian et al. |
| 4,289,836 A | 9/1981 | Lemelson |
| 4,290,109 A | 9/1981 | Taniguchi et al. |
| 4,295,097 A | 10/1981 | Thompson et al. |
| 4,302,714 A | 11/1981 | Yefsky |
| 4,308,492 A | 12/1981 | Mori et al. |
| 4,308,493 A | 12/1981 | Kothe et al. |
| 4,329,226 A | 5/1982 | Thompson |
| 4,333,149 A | 6/1982 | Taylor et al. |
| 4,346,336 A | 8/1982 | Crawford |
| 4,365,290 A | 12/1982 | Nelms et al. |
| 4,370,606 A | 1/1983 | Kakumoto et al. |
| 4,377,787 A | 3/1983 | Kikuoka et al. |
| 4,379,966 A | 4/1983 | Flies |
| 4,387,334 A | 6/1983 | Loper |
| 4,388,618 A | 6/1983 | Finger |
| 4,390,841 A | 6/1983 | Martin et al. |
| 4,392,101 A | 7/1983 | Saar et al. |
| 4,394,741 A | 7/1983 | Lowndes |
| 4,412,137 A | 10/1983 | Hansen et al. |
| 4,419,616 A | 12/1983 | Baskins et al. |
| 4,424,476 A | 1/1984 | Mullersman |
| 4,455,523 A | 6/1984 | Koenck |
| 4,455,551 A | 6/1984 | Lemelson |
| 4,472,672 A | 9/1984 | Pacholok |
| 4,494,064 A | 1/1985 | Harkness |
| 4,525,055 A | 6/1985 | Yokoo |
| 4,542,462 A | 9/1985 | Morishita et al. |
| 4,553,081 A | 11/1985 | Koenck |
| 4,554,500 A | 11/1985 | Sokira |
| 4,558,281 A | 12/1985 | Codd et al. |
| 4,560,937 A | 12/1985 | Finger |
| 4,575,679 A | 3/1986 | Chung et al. |
| 4,593,272 A | 6/1986 | Berkowitz |
| 4,607,208 A | 8/1986 | Vreeland |
| 4,621,189 A | 11/1986 | Kumar et al. |
| 4,625,175 A | 11/1986 | Smith |
| 4,649,333 A | 3/1987 | Moore |
| 4,649,373 A | 3/1987 | Bland et al. |
| 4,667,143 A | 5/1987 | Cooper et al. |
| 4,670,703 A | 6/1987 | Williams |
| 4,677,143 A | 6/1987 | Laurin et al. |
| 4,678,998 A | 7/1987 | Myramatsu |
| 4,692,682 A | 9/1987 | Lane et al. |
| 4,709,202 A | 11/1987 | Koenck et al. |
| 4,716,354 A | 12/1987 | Hacker |
| 4,719,427 A | 1/1988 | Morishita et al. |
| 4,723,079 A | 2/1988 | Norton |
| 4,737,702 A | 4/1988 | Koenck |
| 4,743,855 A | 5/1988 | Randin et al. |
| 4,758,945 A | 7/1988 | Remedi |
| 4,773,032 A | 9/1988 | Uehara et al. |
| 4,829,226 A | 5/1989 | Nakamura et al. |
| 4,829,259 A | 5/1989 | Konopka |
| 4,833,390 A | 5/1989 | Kumada et al. |
| 4,842,966 A | 6/1989 | Omori et al. |
| 4,845,419 A | 7/1989 | Hacker |
| 4,849,682 A | 7/1989 | Bauer et al. |
| 4,849,700 A | 7/1989 | Morioka et al. |
| 4,850,009 A | 7/1989 | Zook et al. |
| 4,862,013 A | 8/1989 | Konopka |
| 4,876,513 A | 10/1989 | Brilmyer et al. |
| 4,885,522 A | 12/1989 | Konopka |
| 4,885,523 A | 12/1989 | Koenck ..................... 320/21 |
| 4,916,441 A | 4/1990 | Gombrich |
| 4,929,931 A | 5/1990 | McCuen |
| 4,947,123 A | 8/1990 | Minezawa |
| 4,961,043 A | 10/1990 | Koenck |
| 4,965,738 A | 10/1990 | Bauer et al. |
| 5,013,993 A | 5/1991 | Bhagwat et al. |
| 5,032,825 A | 7/1991 | Kuznicki |
| 5,057,383 A | 10/1991 | Sokira |
| 5,061,898 A | 10/1991 | Bram et al. |
| 5,110,226 A | 5/1992 | Sherman et al. |
| 5,115,182 A | 5/1992 | Ehmke et al. |
| 5,130,659 A | 7/1992 | Sloan |
| 5,136,231 A | 8/1992 | Faulk |
| 5,136,620 A | 8/1992 | Eaves |
| 5,140,310 A | 8/1992 | DeLuca et al. |
| 5,150,031 A | 9/1992 | James et al. |
| 5,159,272 A | 10/1992 | Rao et al. |
| 5,166,623 A | 11/1992 | Ganio |
| 5,191,277 A | 3/1993 | Ishikura et al. |
| 5,200,689 A | 4/1993 | Interiano et al. |
| 5,204,611 A | 4/1993 | Nor et al. |
| 5,278,487 A | 1/1994 | Koenck |
| 5,278,509 A | 1/1994 | Haynes et al. |
| 5,281,955 A | 1/1994 | Reich et al. |
| 5,284,719 A | 2/1994 | Landau et al. |
| 5,321,627 A | 6/1994 | Reher |
| 5,341,503 A | 8/1994 | Gladstein et al. |
| 5,349,282 A | 9/1994 | McClure |
| 5,349,535 A | 9/1994 | Gupta |
| 5,352,982 A | 10/1994 | Nakazawa et al. |
| 5,363,031 A | 11/1994 | Miller et al. |
| 5,365,160 A | 11/1994 | Leppo et al. |
| 5,365,221 A | 11/1994 | Fennell et al. |
| 5,371,453 A | 12/1994 | Fernandez |
| 5,371,682 A | 12/1994 | Levine et al. |
| 5,422,558 A | 6/1995 | Stewart |
| 5,422,822 A | 6/1995 | Toyota et al. |
| 5,432,429 A | 7/1995 | Armstrong, II et al. |
| 5,434,495 A | 7/1995 | Toko |
| 5,444,378 A | 8/1995 | Rogers |
| 5,451,881 A | 9/1995 | Finger |
| 5,454,710 A | 10/1995 | Landau et al. |
| 5,463,305 A | 10/1995 | Koenck |
| 5,483,165 A | 1/1996 | Cameron et al. |
| 5,493,199 A | 2/1996 | Koenck et al. |
| 5,508,599 A | 4/1996 | Koenck |
| 5,539,318 A | 7/1996 | Sasaki |
| 5,541,489 A | 7/1996 | Dunstan |
| 5,600,230 A | 2/1997 | Dunstan |
| 5,619,117 A | 4/1997 | Koenck |
| 5,625,291 A | 4/1997 | Brink et al. |
| 5,652,069 A | 7/1997 | Sakai et al. |
| 5,652,502 A | 7/1997 | Van Phuoc et al. |
| 5,684,404 A | 11/1997 | Millar |
| 5,691,742 A | 11/1997 | O'Connor et al. |
| 5,696,435 A | 12/1997 | Koenck |
| 5,698,983 A | 12/1997 | Arai et al. |
| 5,717,256 A | 2/1998 | Okumura et al. |
| 5,751,134 A | 5/1998 | Hoerner et al. |
| 5,773,961 A | 6/1998 | Cameron et al. |
| 5,773,977 A | 6/1998 | Dougherty |
| 5,789,901 A | 8/1998 | Lomholt |
| 5,801,514 A | 9/1998 | Saeki et al. |
| 5,834,922 A | 11/1998 | Ikawa et al. |
| 5,856,737 A | 1/1999 | Miller et al. |
| 5,883,492 A | 3/1999 | Koenck |

| | | | |
|---|---|---|---|
| 5,883,493 | A | 3/1999 | Koenck |
| 5,889,386 | A | 3/1999 | Koenck |
| 5,986,435 | A | 11/1999 | Koenck |
| 6,043,630 | A | 3/2000 | Koenck |
| 6,075,340 | A | 6/2000 | Koenck |
| 6,075,342 | A | 6/2000 | Koenck |
| 6,252,380 | B1 | 6/2001 | Koenck |

FOREIGN PATENT DOCUMENTS

| | | | |
|---|---|---|---|
| DE | 2520599 | A | 11/1976 |
| FR | 2589292 | A | 4/1987 |
| GB | 1354491 | A | 6/1974 |
| JP | 56-028476 | A | 3/1981 |
| WO | WO-8802565 | A | 4/1988 |
| WO | WO-8902182 | A | 3/1989 |
| WO | WO 9107002 | A | 5/1991 |
| WO | WO-9108604 | A | 6/1991 |

OTHER PUBLICATIONS

82104 A Card Reader Owner's Handbook, Hewlett–Packard, 1979 (Printed Mar. 1982).

82104 A Card Reader Service Manual, Hewlett–Packard, Jul. 1979.

82143 A Printer Owner's Handbook, Hewlett–Packard, Nov. 1979.

Automated Management of Power Systems, Matthew S. Imamura, Martin Marietta Corp. and Arthur Bridgeforth, Jet Propulsion Laboratory, Pasadena California, Report 79–0886, pp. 571–580, © American Institute of Aeronautics and Astronautics, Inc. 1979.

Automated Power Systems Management (APSM), NASA, Jet Propulsion Laboratory, California Institute of Technology, Pasadena, California, JPL Publication 81–106 dated Nov. 15, 1981.

Battery Maintenance System Using A Microcomputer, Keinosuke Muracami and Kotaro Wakui, NHK Laboratories Note, Serial No. 302, Jul. 1984.

Battery Maintenance System Using Microcomputer, Keinosuke Murakami et al., Institute of Televison Engineers Technology Report, vol. 4, No. 44, Mar. 1981. * Certified English language translation.

Battery Management Using Microprocessors, C. Gayet, European Space Research and Technology Centre (ESTEC) Noordwijk, The Netherlands, Proceedings of the Third ESTEC Spacecraft Power Conditioning Seminar, Sep. 21–23, 1977, ESA SP–126 Report N78–15125, pp. 251–262.

COP420C/COP421C and COP320C/COP321C Single–Chip CMOS Microcontrollers, COPS Microcontrollers Databook, pp. 2–45 to 2–63, National Semiconductor Corporation, © 1982.

COPS 402C Microcontroller Databook (??) See Saar report, e.g. pp. 99–100, and Tables. Appears to be a transposition of 420C.

Declaration of Harry L. Martin, re U.S. Patent No. 4,390,841 (Nov. 21, 2002).

Declaration of Martin Brown, Mar. 5, 2001, in support of Compaq's Motion for Partial Summary Judgment of Invalidity Based on Three Exemplars of Prior Art, (Winslade Schedule at 3).

Design of Portable Data–Logging Systems, G Peacock, Electronics & Power, Feb. 1981, pp. 155–157.

Development and Operation of Hand–held High Sensitivity Color Camera, Kazunori Ohnishi et al., ITE Corporation Television Society Technology Report TEBS 62–1, vol. 4, No. 2, Jun. 17, 1980. (Engl Translation).

Development of Automated Power Systems Management For Planetary Spacecraft, Arthur O. Bridgeforth, Jet Propulsion Laboratory, Pasadena, CA, Doc. 809135, pp. 709–714, undated.

Expert Report of David A. Saar, discussing prior art, Aug. 23, 2001.

Flags, Sec. 14, pp. 209–211, HP–41C/41CV Owner's Handbook And Programming Guide, Hewlett–Packard, undated.

Hewlett–Packard Journal, Mar. 1980, pp. 1–26.

HP–41C Alphanumeric Programmable Scientific Calculator Service Manual, Hewlett–Packard Co., Jul. 1979.

Institute of Television Engineers Technology Report, vol. 4, No. 44, Mar. 1981.

NSC800 Microprocessor Cookbook, Roger C. Alford, Tab Books Inc., No. 1502, Copyright 1983.

NT121 Documents, UD011981–UD011988 and UD006048–UD006068. Referenced in Saar Declaration.

Programmable Power Processor (P3), F.E. Lukens & R.L. Moser, Martin Marietta Denver Aerospace, Proceedings of the 16th Intersociety Energy Conversion Engineering Conference, Aug. 9–14, 1981, pp. 241–249.

System Maintenance of an ENG System Using A Micro–Computer (I) muDDC Hand–held High Sensitivity Color Camera, Keinosuke Murakami et al., NHK Technical Research Laboratories, Television Society Technical Report, TEBS 62–2, pp. 1–13, May 13, 1980. (Engl Translation).

*Primary Examiner*—Woo H Choi

(57) ABSTRACT

In an exemplary embodiment, a battery conditioning system monitors battery conditioning and includes a memory for storing data based thereon; for example, data may be stored representative of available battery capacity as measured during a deep discharge cycle. With a microprocessor monitoring battery operation of a portable unit, a measure of remaining battery capacity can be calculated and displayed. Where the microprocessor and battery conditioning system memory are permanently secured to the battery so as to receive operating power therefrom during storage and handling, the performance of a given battery in actual use can be accurately judged since the battery system can itself maintain a count of accumulated hours of use and other relevant parameters. In the case of a non-portable conditioning system, two-way communication may be established with a memory associated with the portable unit so that the portable unit can transmit to the conditioning system information concerning battery parameters (e.g. rated battery capacity) and/or battery usage (e.g. numbers of shallow discharge and recharge cycles), and after a conditioning operation, the conditioning system can transmit to the portable unit a measured value of battery capacity, for example. A battery pack having memory stores battery history and identifying data to be retrieved by a portable battery powered device. Battery status information may be utilized in conjunction with characteristic battery history data in order to optimize charging and discharging functions and to maximize the useful life of a battery pack.

EX PARTE REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

The patentability of claims 2–5 is confirmed.

Claims 1 and 6–10 are cancelled.

* * * * *